(12) United States Patent
Yang et al.

(10) Patent No.: US 9,269,668 B2
(45) Date of Patent: Feb. 23, 2016

(54) INTERCONNECT HAVING AIR GAPS AND POLYMER WRAPPED CONDUCTIVE LINES

(71) Applicant: Taiwan Semiconductor Manufacturing Company, Ltd., Hsin-Chu (TW)

(72) Inventors: Shin-Yi Yang, New Taipei (TW); Hsiang-Huan Lee, Jhudong Township (TW); Ming-Han Lee, Taipei (TW); Hsi-Wen Tien, Xinfeng Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/334,463

(22) Filed: Jul. 17, 2014

(65) Prior Publication Data

US 2016/0020176 A1 Jan. 21, 2016

(51) Int. Cl.
| | |
|---|---|
| *H01L 23/52* | (2006.01) |
| *H01L 29/00* | (2006.01) |
| *H01L 23/532* | (2006.01) |
| *H01L 23/522* | (2006.01) |
| *H01L 23/528* | (2006.01) |
| *H01L 21/768* | (2006.01) |
| *H01L 21/311* | (2006.01) |
| *H01L 21/02* | (2006.01) |
| *H01L 23/538* | (2006.01) |

(52) U.S. Cl.
CPC .... *H01L 23/53228* (2013.01); *H01L 21/02118* (2013.01); *H01L 21/02345* (2013.01); *H01L 21/31133* (2013.01); *H01L 21/7682* (2013.01); *H01L 21/76802* (2013.01); *H01L 21/76828* (2013.01); *H01L 21/76877* (2013.01); *H01L 23/528* (2013.01); *H01L 23/5226* (2013.01); *H01L 23/5329* (2013.01); *H01L 23/5384* (2013.01); *H01L 2924/06* (2013.01)

(58) Field of Classification Search
CPC .................. H01L 23/5384; H01L 2924/06
See application file for complete search history.

(56) References Cited

U.S. PATENT DOCUMENTS

| | | | | | |
|---|---|---|---|---|---|
| 5,668,398 | A | * | 9/1997 | Havemann et al. | 257/522 |
| 6,165,897 | A | * | 12/2000 | Jang | 438/637 |
| 6,265,321 | B1 | * | 7/2001 | Chooi et al. | 438/725 |
| 6,303,464 | B1 | * | 10/2001 | Gaw et al. | 438/422 |
| 6,445,072 | B1 | * | 9/2002 | Subramanian et al. | 257/758 |
| 6,841,844 | B2 | * | 1/2005 | Hsu et al. | 257/522 |
| 7,037,744 | B2 | * | 5/2006 | Colburn et al. | 438/52 |
| 7,094,669 | B2 | * | 8/2006 | Bu et al. | 438/462 |
| 7,132,306 | B1 | * | 11/2006 | Rhee et al. | 438/42 |
| 7,285,474 | B2 | * | 10/2007 | Anderson et al. | 438/411 |
| 7,405,149 | B1 | * | 7/2008 | Lin et al. | 438/622 |
| 7,553,756 | B2 | * | 6/2009 | Hayashi et al. | 438/622 |
| 7,662,722 | B2 | * | 2/2010 | Stamper et al. | 438/719 |
| 7,842,600 | B2 | * | 11/2010 | Yun et al. | 438/619 |

(Continued)

*Primary Examiner* — Ida M Soward
(74) *Attorney, Agent, or Firm* — Slater & Matsil, L.L.P.

(57) ABSTRACT

A device includes a first conductive line in a first metallization layer over a dielectric layer, wherein the first conductive line is wrapped by a first polymer layer on three sides and the first conductive line and the dielectric layer are separated by a bottom portion of the first polymer layer, a second conductive line over the dielectric layer, wherein the second conductive line is wrapped by a second polymer layer on three sides and the second conductive line and the dielectric layer are separated by a bottom portion of the second polymer layer and an air gap between the first conductive line and the second conductive line.

20 Claims, 24 Drawing Sheets

(56) References Cited

U.S. PATENT DOCUMENTS

| | | | |
|---|---|---|---|
| 7,960,275 B2* | 6/2011 | Gaillard | 438/619 |
| 8,003,520 B2* | 8/2011 | Bonilla et al. | 438/630 |
| 8,198,701 B2* | 6/2012 | Won et al. | 257/522 |
| 8,241,992 B2* | 8/2012 | Clevenger et al. | 438/421 |
| 8,344,474 B2* | 1/2013 | Seidel et al. | 257/522 |
| 8,461,678 B2* | 6/2013 | Edelstein et al. | 257/735 |
| 8,860,229 B1* | 10/2014 | Lin | 257/774 |
| 8,883,610 B2* | 11/2014 | Seidel et al. | 438/411 |
| 9,087,821 B2* | 7/2015 | Lin | |
| 2005/0037604 A1* | 2/2005 | Babich et al. | 438/619 |
| 2008/0171136 A1* | 7/2008 | Dubois et al. | 427/77 |
| 2008/0185722 A1* | 8/2008 | Liu et al. | 257/751 |
| 2009/0001586 A1* | 1/2009 | Farrar | 257/751 |
| 2009/0087562 A1* | 4/2009 | Lee et al. | 427/255.6 |
| 2009/0294898 A1* | 12/2009 | Feustel et al. | 257/522 |
| 2010/0093168 A1* | 4/2010 | Naik | 438/618 |
| 2012/0276711 A1* | 11/2012 | Yoon et al. | 438/421 |
| 2014/0264896 A1* | 9/2014 | Lu et al. | 257/773 |
| 2015/0145062 A1* | 5/2015 | Chudzik et al. | 257/392 |

* cited by examiner

INTERCONNECT HAVING AIR GAPS AND POLYMER WRAPPED CONDUCTIVE LINES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. Interconnection structures of a semiconductor device may comprise a plurality of lateral interconnections such as metal lines and a plurality of vertical interconnections such as vias, plugs and/or the like. The metal lines of the metallization layers are separated by dielectric layers. Trenches and vias are formed in the dielectric layers to provide an electrical connection between metal lines. Various active circuits of a semiconductor device may be coupled to external circuits through a variety of conductive channels formed by the vertical and lateral interconnections.

The metal lines and vias may be formed of copper. In order to prevent interference such as capacitive coupling between two adjacent metal lines from having an impact on the overall performance of the semiconductor device, low-K dielectric materials may be filled between adjacent metal lines. The low-K dielectric materials may be of a dielectric constant approximately equal to and less than 4.0. Furthermore, air gaps may be employed to further reduce capacitive coupling so as to improve the overall performance characteristics of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
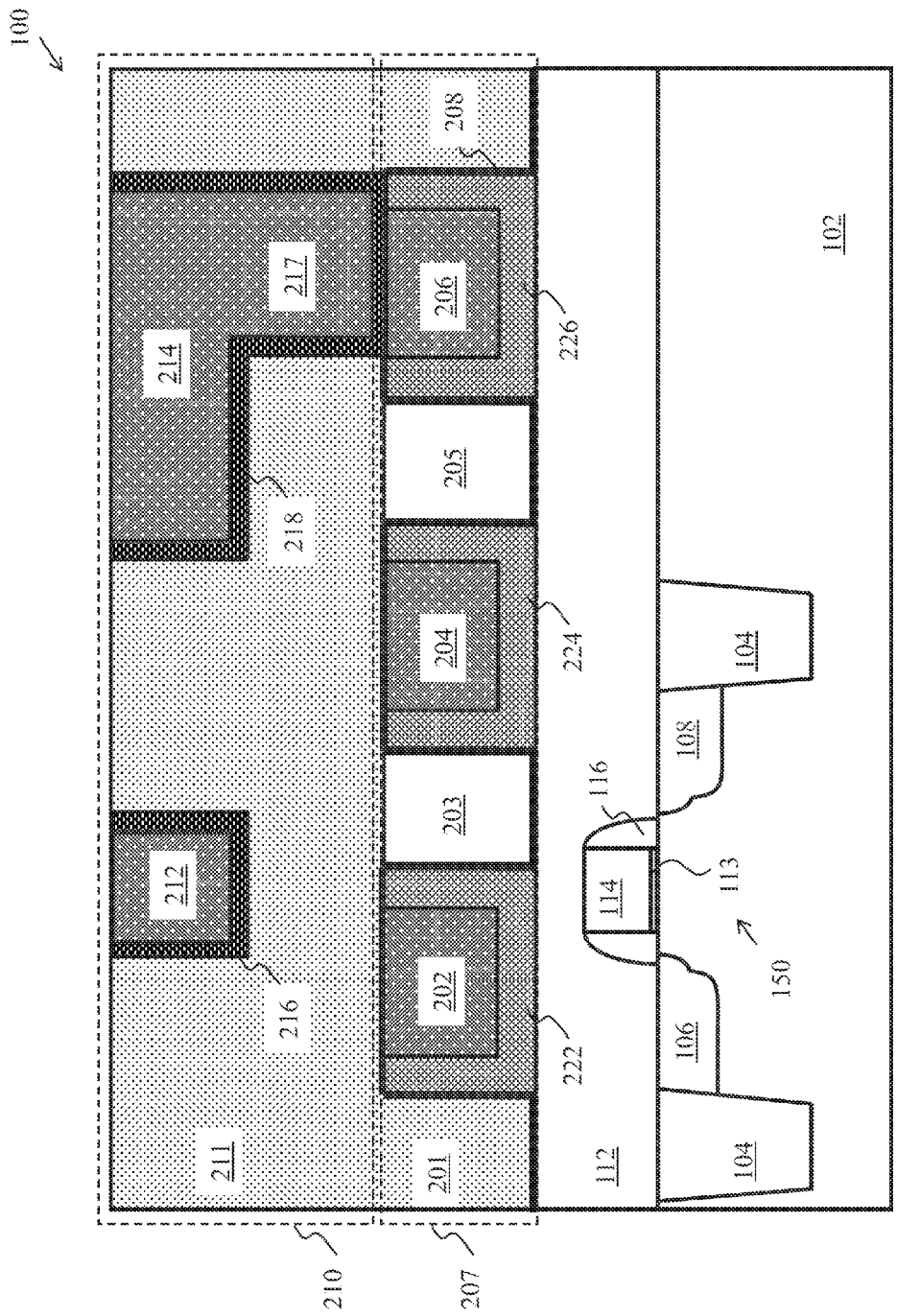
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a semiconductor device in accordance with various embodiments of the present disclosure. The semiconductor device 100 includes a transistor device 150, which is formed in a substrate 102 and a plurality of interconnect structures formed over the substrate 102.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits such as metal oxide semiconductor (MOS) transistors (e.g., transistor device 150) and the associated contact plugs (e.g., contact plug 118). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

As shown in FIG. 1, the transistor device 150 includes a first drain/source region 106 and a second drain/source region 108. The first drain/source region 106 and the second drain/source region 108 are formed on opposite sides of a gate structure of the transistor device 150. The gate structure is formed in a dielectric layer 112 and over the substrate 102. The gate structure may comprise a gate dielectric layer 113, a gate electrode 114 over the gate dielectric layer 113 and spacers 116.

The gate dielectric layer 113 may be a dielectric material such as silicon oxide, silicon oxynitride, silicon nitride, an oxide, a nitrogen-containing oxide, a combination thereof and/or the like. The gate dielectric layer 113 may have a relative permittivity value greater than about 4. Other examples of such materials include aluminum oxide, lanthanum oxide, hafnium oxide, zirconium oxide, hafnium oxynitride, any combinations thereof and/or the like. In an embodiment in which the gate dielectric layer 113 comprises an oxide layer, the gate dielectric layer 113 may be formed by suitable deposition processes such as a plasma enhanced chemical vapor deposition (PECVD) process using tetraethoxysilane (TEOS) and oxygen as a precursor. In accordance with an embodiment, the gate dielectric layer 113 may be of a thickness in a range from about 8 Angstroms to about 200 Angstroms.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is formed of poly-silicon, the gate electrode 114 may be formed by depositing doped or undoped poly-silicon by low-pressure chemical vapor deposition (LPCVD) to a thickness in the range of about 400 Angstroms to about 2,400 Angstroms.

The spacers 116 may be formed by blanket depositing one or more spacer layers (not shown) over the gate electrode 114 and the substrate 102. The spacers 116 may comprise suitable dielectric materials such as SiN, oxynitride, SiC, SiON, oxide and/or the like. The spacers 116 may be formed by commonly used techniques such as chemical vapor deposition (CVD), PECVD, sputtering and/or the like.

The first and second drain/source regions 106 and 108 may be formed in the substrate 102 on opposing sides of the gate dielectric layer 113. In an embodiment in which the substrate 102 is an n-type substrate, the first and second drain/source regions 106 and 108 may be formed by implanting appropriate p-type dopants such as boron, gallium, indium and/or the like. Alternatively, in an embodiment in which the substrate 102 is a p-type substrate, the first and second drain/source regions 106 and 108 may be formed by implanting appropriate n-type dopants such as phosphorous, arsenic and/or the like.

As shown in FIG. 1, there may be two isolation regions formed on opposite sides of the transistor device 150. The isolation regions 104 may be shallow trench isolation (STI) regions. The STI regions may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical planarization (CMP) process may be applied to the top surface so that the excess dielectric material may be removed as a result.

The dielectric layer 112 is formed on top of the substrate 102. The dielectric layer 112 may be formed, for example, of a low-K dielectric material, such as silicon oxide. The dielectric layer 112 may be formed by any suitable method known in the art, such as spinning, CVD and PECVD. It should also be noted that one skilled in the art will recognize while FIG. 1 illustrates a single dielectric layer, the dielectric layer 112 may comprise a plurality of dielectric layers.

A first dielectric layer 201 is formed over the dielectric layer 112. In some embodiments, the first dielectric layer 201 is part of a first metallization layer 207. As shown in FIG. 1, there may be three metal lines 202, 204 and 206 formed in the first metallization layer 207. Each metal line (e.g., metal line 202) is surrounded by a polymer based structure (e.g., structure 222). In some embodiments, the polymer based structures 222, 224 and 226 are formed of polyimide. In alternative embodiments, the polymer based structures 222, 224 and 226 are formed of crosslinking epoxy.

As shown in FIG. 1, there may be three polymer based structures 222, 224 and 226. Each polymer based structure (e.g., structure 222) comprises two sidewall portions and a bottom portion. For example, as shown in FIG. 1, the bottom portion of the polymer based structure 222 is formed between the dielectric layer 112 and the corresponding metal line 202. More particularly, a bottom surface of the bottom portion of the polymer based structure 222 is in direct contact with a top surface of the dielectric layer 112. A top surface of the bottom portion of the polymer based structure 222 is in direct contact with a bottom surface of the metal line 202. The polymer based structures 224 and 226 are similar to the polymer based structure 222, and hence are not described in detail herein.

In some embodiments, the metal lines 202, 204 and 206 may be formed of suitable metal materials such as copper, copper alloys, aluminum, silver, tungsten, gold, any combinations thereof and/or the like.

FIG. 1 further illustrates the first metallization layer 207 comprises two air gaps 203 and 205. As shown in FIG. 1, a first air gap 203 is between the metal lines 202 and 204. A second air gap 205 is between the metal lines 204 and 206. The formation process of the air gaps 203 and 205 will be described below in detail with respect to FIG. 14.

It should be noted that while FIG. 1 illustrates two air gaps are formed in the first metallization layer 207, the semiconductor device 100 could accommodate any number of air gaps. Two air gaps (e.g., air gaps 203 and 205) are illustrated for simplicity.

A second dielectric layer 211 is formed over the first dielectric layer 201. The second dielectric layer 211 is part of a second metallization layer 210. As shown in FIG. 1, there may be two metal lines 212 and 214 formed in the second metallization layer 210. In addition, there may be a via 217 formed in the second metallization layer 210. As shown in FIG. 1, the via 217 is coupled between the metal line 214 and the metal line 206. In some embodiments, the via 217 and the metal line 214 may be formed through suitable semiconductor fabrication processes such as a dual damascene process.

While FIG. 1 shows one metallization layer (e.g., the second metallization layer 210) formed over the first metallization layer 207, one skilled in the art will recognize that more inter-metal dielectric layers (not shown) and the associated metal lines and vias (not shown) may be formed over the metallization layer 210. In particular, the additional layers may be formed by alternating layers of dielectric (e.g., extremely low-k dielectric material) and conductive materials (e.g., copper).

FIG. 1 further illustrates the semiconductor device 100 comprises an etch stop layer 208, a first barrier layer 216 and a second barrier layer 218. The etch stop layer 208 is formed over the metal lines 202, 204 and 206. In some embodiments, the etch stop layer 208 may be employed to provide etching selectivity. In alternative embodiments, the etch stop layer 208 may function as a barrier layer to prevent diffusion of the metal (e.g., copper) of the metal lines 202, 204 and 206 into the surrounding dielectric layers (e.g., dielectric layer 201). The first barrier layer 216 is formed underneath the metal line 212. The first barrier layer 216 wraps the metal line 212 around three sides. The barrier layer 216 prevents the metal of the metal line 212 from diffusing into the dielectric layer 211. Likewise, the second barrier layer 218 is used to prevent the metal of the metal line 214 and the via 217 from diffusing into the dielectric layer 211.

Figure 2:
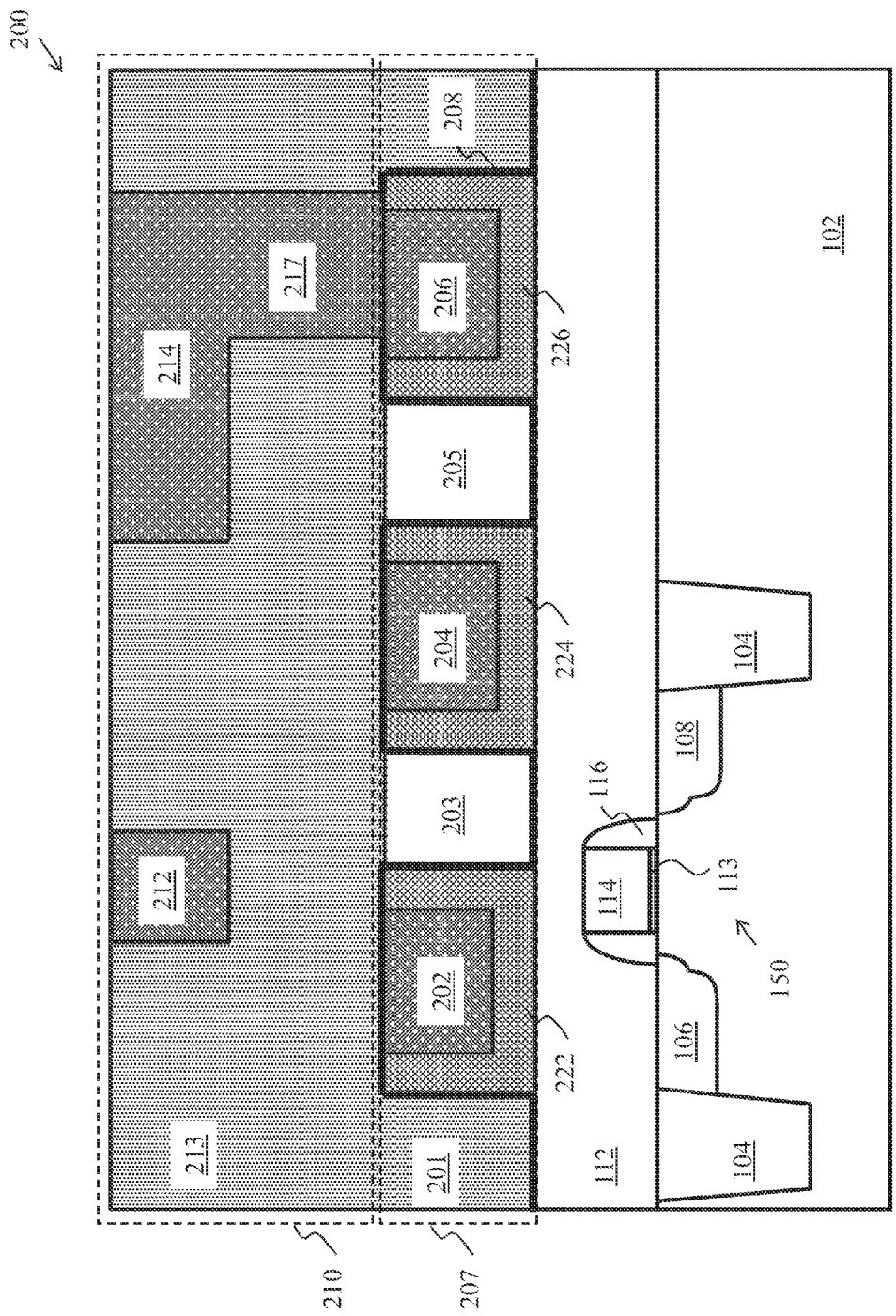
FIG. 2 illustrates a cross sectional view of another semiconductor device in accordance with various embodiments of the present disclosure.

FIG. 2 illustrates a cross sectional view of another semiconductor device in accordance with various embodiments of the present disclosure. The semiconductor device 200 shown in FIG. 2 is similar to the semiconductor device 100 shown in FIG. 1 except that the dielectric layer 213 is formed of polymer such as polyimide. Since the dielectric layer 213 is a polymer layer, the barrier layers 216 and 218 shown in FIG. 1 may be omitted. The barrier-free structure shown in FIG. 2 may help to reduce the interface resistance between the via 217 and the metal line 206. The detailed formation processes of the semiconductor device 200 will be described below with respect to FIGS. 19-22.

Figure 3:
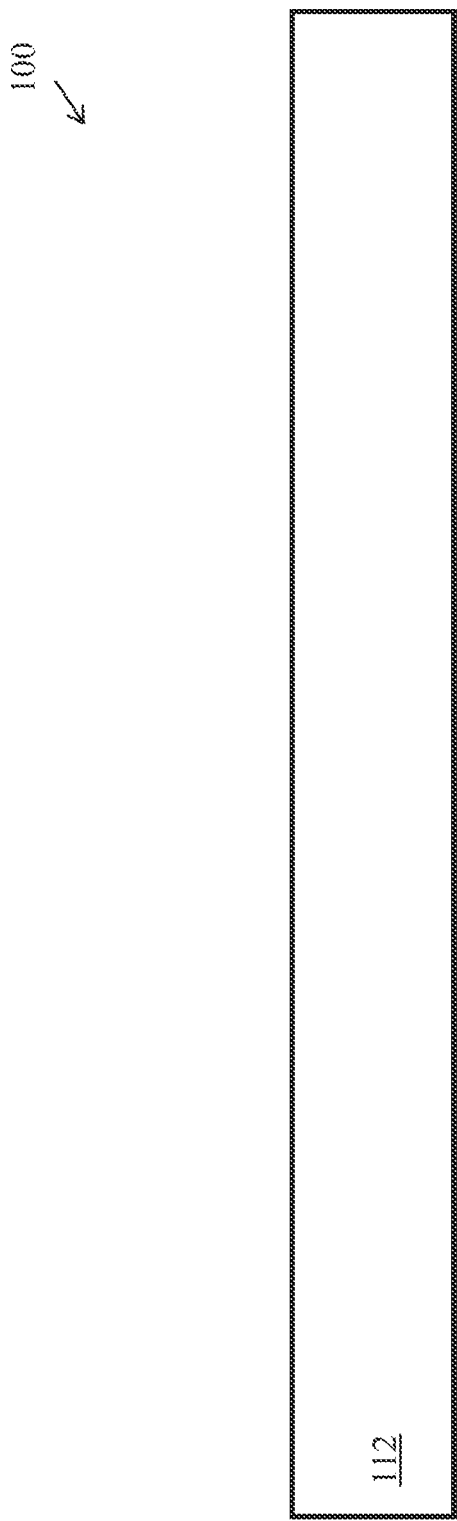
FIGS. 3-17 illustrate intermediate steps of fabricating the semiconductor device shown in FIG. 1 in accordance with various embodiments of the present disclosure.

FIGS. 3-17 illustrate intermediate steps of fabricating the semiconductor device shown in FIG. 1 in accordance with various embodiments of the present disclosure. FIG. 3 illustrates a cross sectional view of a dielectric layer in accordance with various embodiments of the present disclosure. The dielectric layer 112 may be formed of a low-K dielectric material such as fluorosilicate glass (FSG) and/or the like. The dielectric layer 112 may function as an inter-metal dielectric layer. The dielectric layer 112 may be formed by suitable deposition techniques such as PECVD techniques, high-density plasma chemical vapor deposition (HDPCVD) and/or the like. It should be noted other features of the semiconductor device 100 shown in FIG. 1 are omitted form FIG. 3 for clarity.

Figure 4:
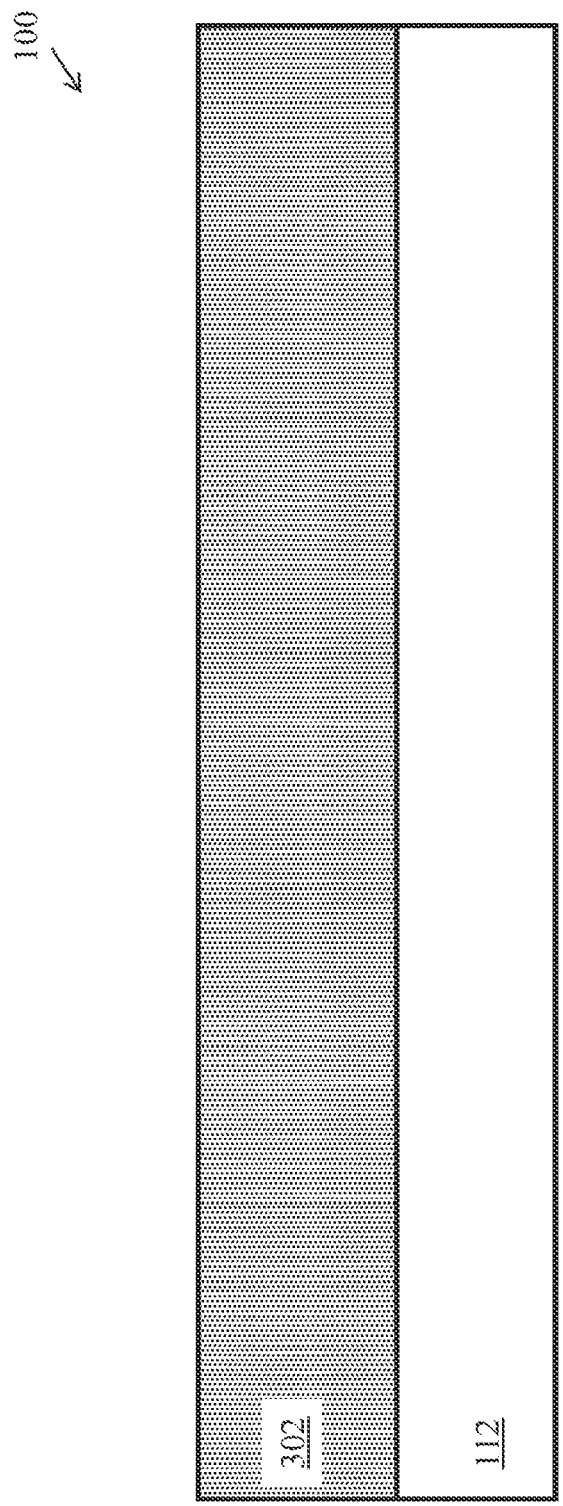

FIG. 4 illustrates a cross sectional view of the semiconductor device shown in FIG. 3 after a polymer layer is formed over the dielectric layer in accordance with various embodiments. The polymer layer 302 is deposited over the dielectric layer 112 through suitable semiconductor fabrication processes such as a spin-coating process and/or the like. Depending on different applications and design needs, the thickness of the polymer layer 302 may vary accordingly. In some embodiments, the thickness of the polymer layer 302 is greater than the thickness of the metal lines 202, 204 and 206 shown in FIG. 1.

Figure 5:
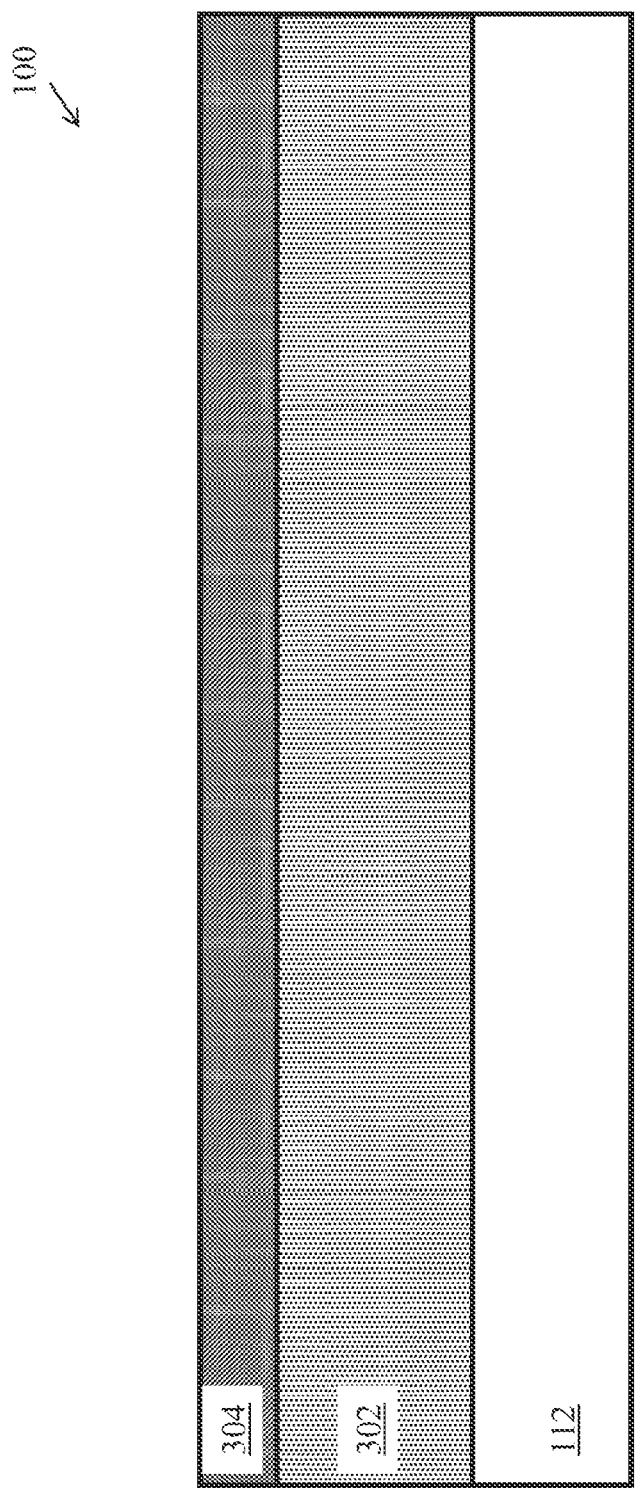

In some embodiments, the polymer layer 302 is formed of a first polymer material such as polyamic acid having the following schematic chemical formula:

FIG. 5 illustrates a cross sectional view of the semiconductor device shown in FIG. 4 after an antireflection layer is formed over the polymer layer in accordance with various embodiments. The antireflection layer 304 is employed to reduce reflection during subsequent lithography patterning processes. The antireflection layer 304 is a nitrogen-free antireflection layer (NFARC) formed over the polymer layer 302 through suitable deposition processes such as CVD, spin-coating and/or the like.

Figure 6:
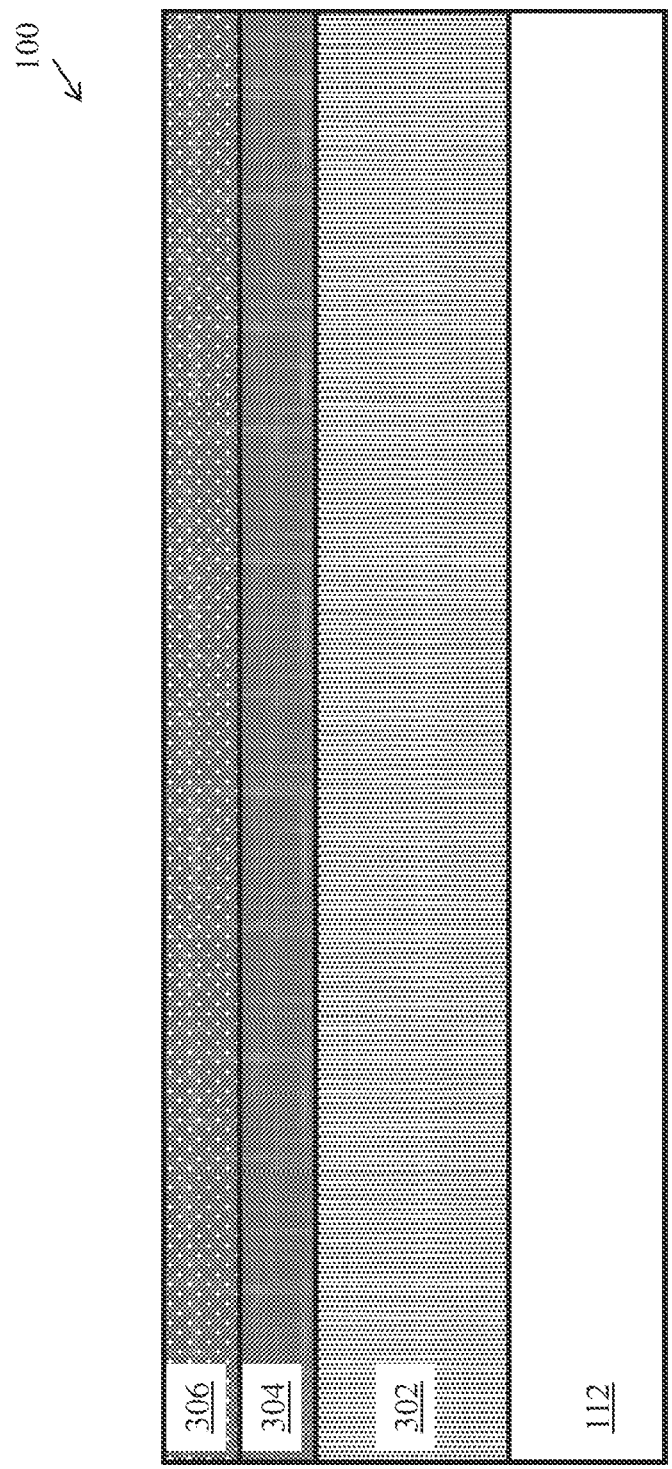

FIG. 6 illustrates a cross sectional view of the semiconductor device shown in FIG. 5 after a mask layer is formed over the antireflection layer in accordance with various embodiments. The mask layer 602 may function as a hard mask during subsequent photolithography processes. Throughout the description, the mask layer 602 may be alternatively referred to as the hard mask layer 602.

In some embodiments, the hard mask layer 602 may be a metal-hard-mask (MHM) layer. The hard mask layer 602 may be formed of titanium nitride (TiN). Alternatively, the hard mask layer 602 may be formed of other suitable materials such as tantalum nitride (TaN) and/or the like.

The hard mask layer 602 may be formed by suitable semiconductor fabrication techniques such as CVD and/or the like. The hard mask layer 602 may be of a thickness in a range from about 200 Angstroms to about 1400 Angstroms.

It should be noted while FIG. 6 illustrates a single hard mask layer 602, one of ordinary skill in the art would recognize many variations, alternatives, and modifications. For example, a multi-layer hard mask may also be used.

Figure 7:
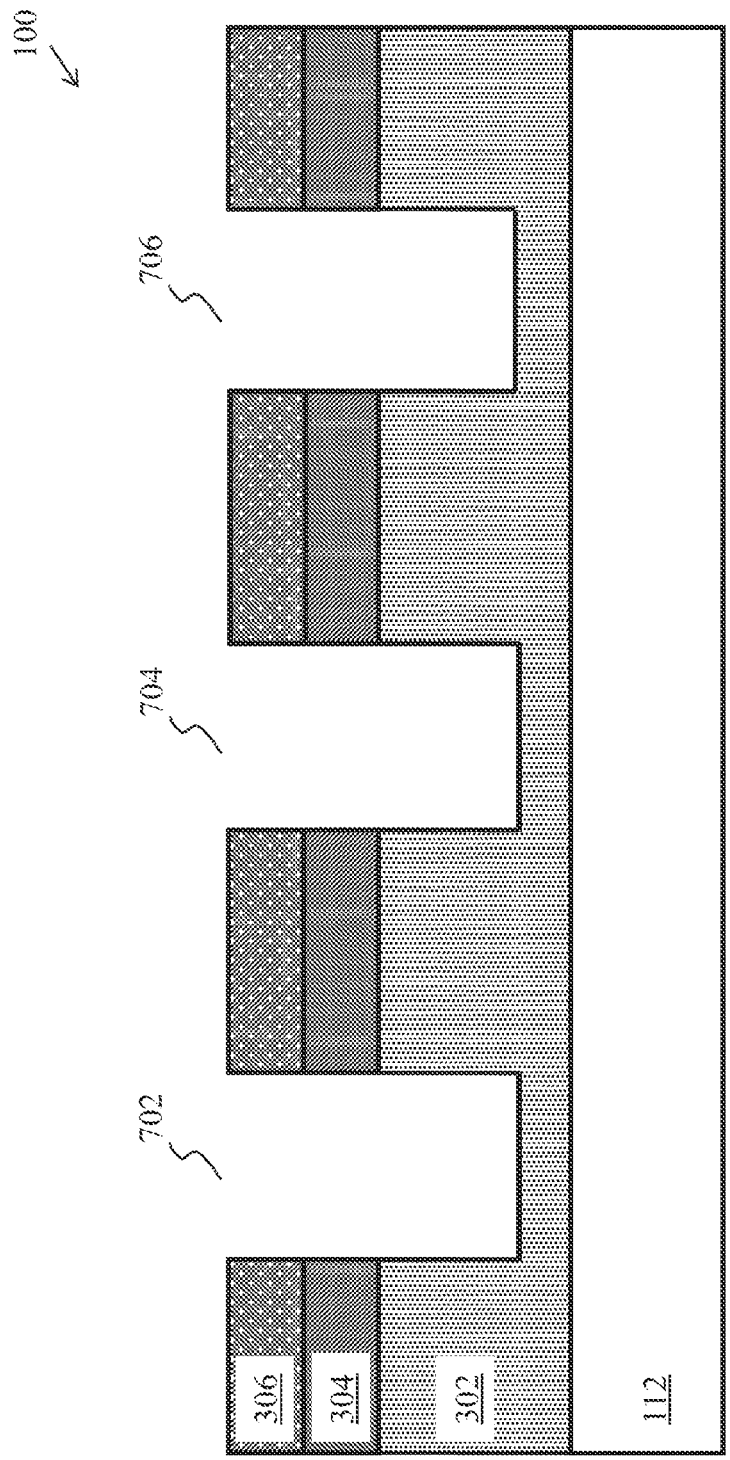

FIG. 7 illustrates a cross sectional view of the semiconductor device shown in FIG. 6 after a plurality of openings are formed in the polymer layer in accordance with various embodiments. According to the location of the metal lines 202, 204 and 206 shown in FIG. 1, openings 702, 704 and 706 are formed in the polymer layer 302. The openings 702, 704 and 706 are partially through the polymer layer 302.

The openings 702, 704 and 706 may be formed by any suitable semiconductor patterning techniques such as an etching process, a laser ablation process and/or the like. For example, the openings 702, 704 and 706 may be formed by

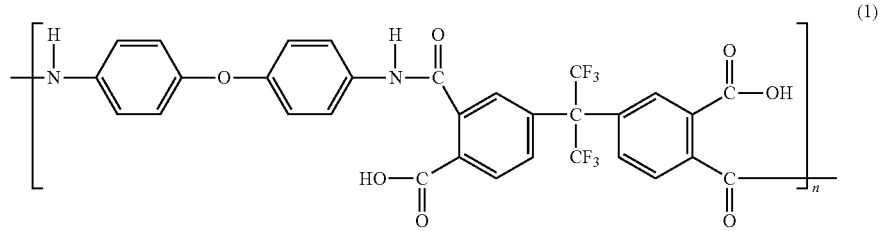

(1)

In alternative embodiments, the polymer layer 302 may be formed of a second polymer material such as epoxy having the following schematic chemical formula:

using photolithography techniques to deposit and pattern a photoresist material (not shown) over the semiconductor device 100. A portion of the photoresist is exposed according

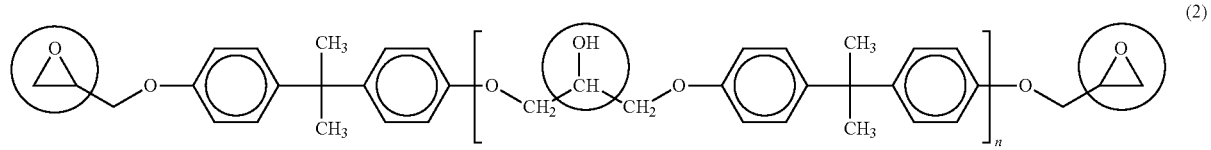

(2)

to the location and shape of the metal lines 202, 204 and 206 shown in FIG. 1. An etching process, such as an anisotropic dry etch process, may be used to form the openings 702, 704 and 706 extending partially through the polymer layer 302. The remaining portion of the polymer layer under the openings (e.g., opening 702) is of a thickness in a range from about 1 nm to about 5 nm.

Figure 8:
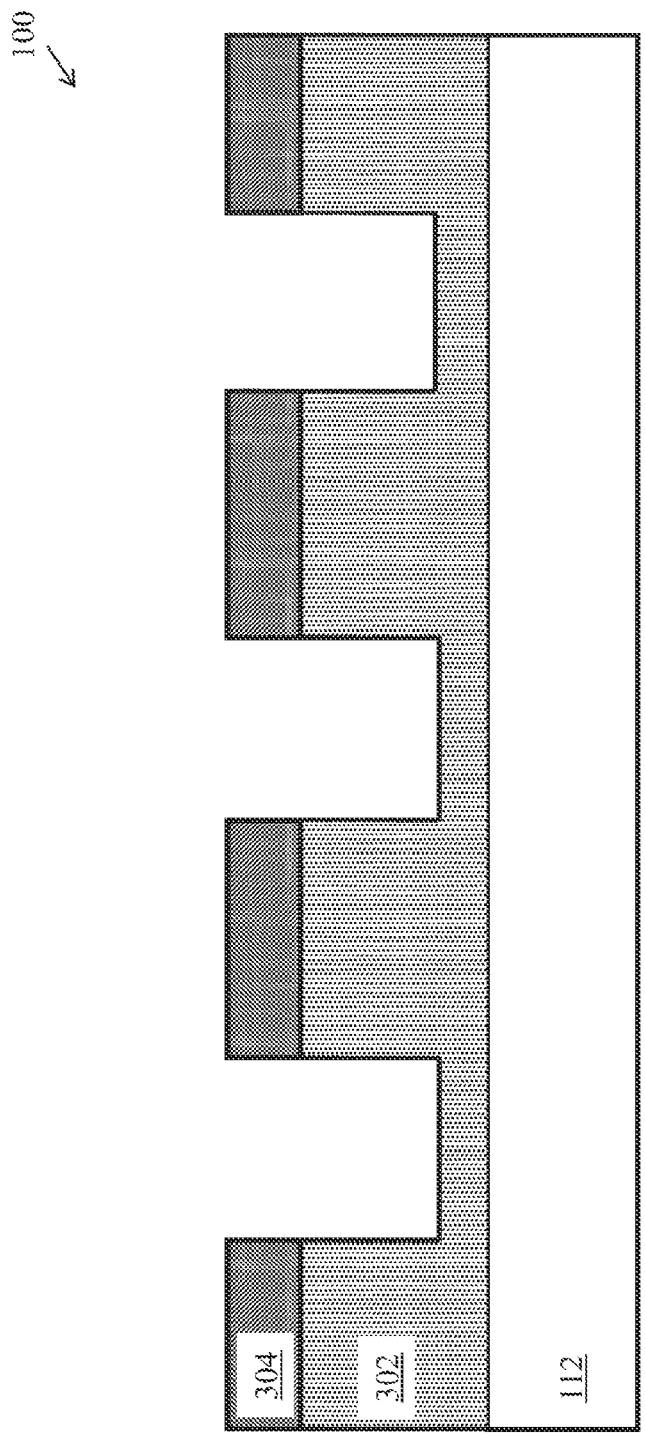

FIG. 8 illustrates a cross sectional view of the semiconductor device shown in FIG. 7 after a hard mask removal process are applied to the semiconductor device in accordance with various embodiments of the present disclosure. The remaining hard mask layer 306 shown in FIG. 7 may be removed using, for example, a wet etch process, a dry etch process or other suitable processes.

Figure 9:
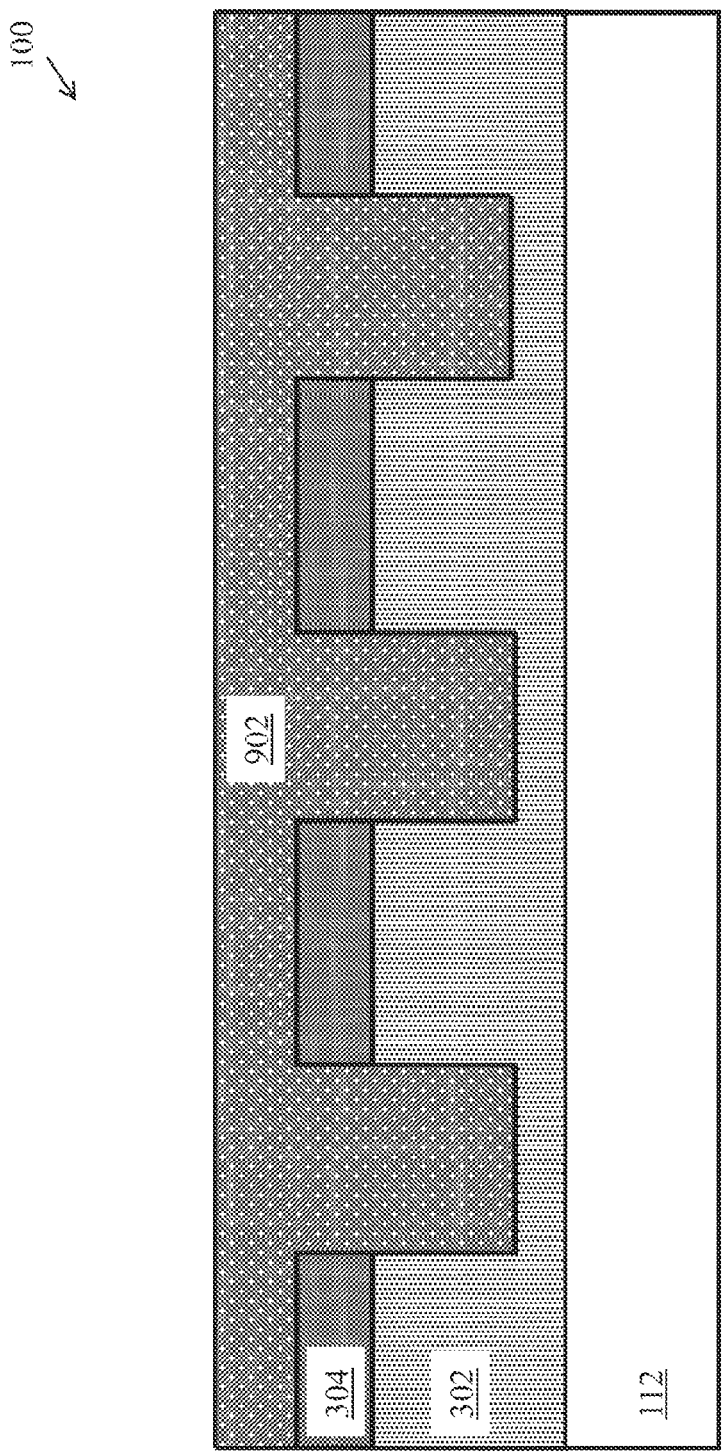

FIG. 9 illustrates a cross sectional view of the semiconductor device shown in FIG. 8 after a conductive material is filled in the openings in accordance with various embodiments of the present disclosure. In some embodiments, a seed layer (not shown) may be formed in each opening. The seed layer may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between these two layers. The alloying material may be introduced during formation of the seed layer. The alloying material may comprise no more than about 10% of the seed layer. It should be noted that other layers such as barrier layers, glue layers and/or the like may also be used depending on different applications and design needs.

Once the seed layer is formed, a conductive material 902 is then filled in the openings 702, 704 and 706. The conductive material may be copper, but can be any suitable conductive materials, such as copper alloys, aluminum, tungsten, titanium, silver, any combinations thereof and/or the like. The conductive material may be formed by suitable fabrication techniques such as an electro-less plating process, CVD, electroplating and/or the like.

It should be noted the conductive material such as copper is surrounded by the polymer layer 302 formed of a polymer material (e.g., polyamic acid). It is not necessary to have a barrier layer underneath the conductive material because copper is not able to diffuse into the polymer material.

Figure 10:
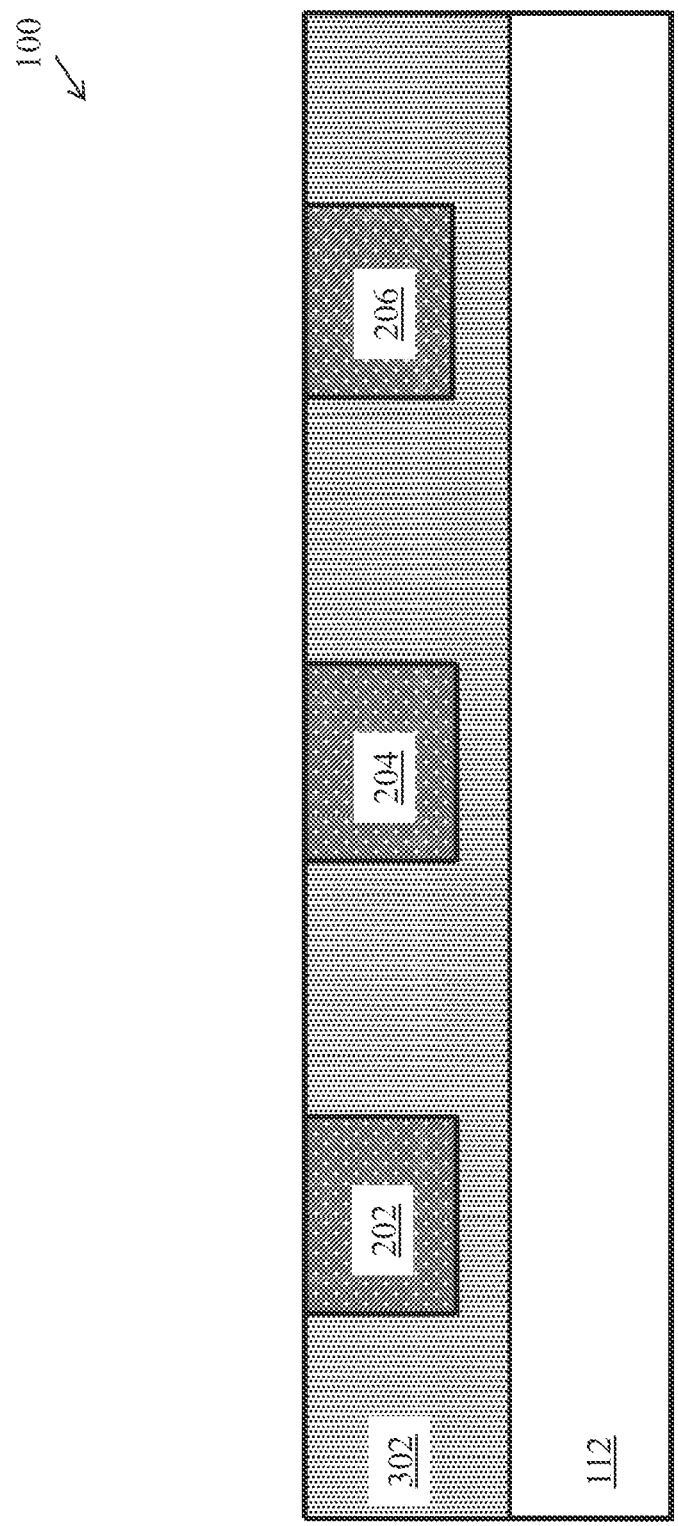

FIG. 10 illustrates a cross sectional view of the semiconductor device shown in FIG. 9 after a planarization process is performed to remove excess conductive materials in accordance with various embodiments of the present disclosure. The planarization process may be implemented by using suitable techniques such as grinding, polishing and/or chemical etching, a combination of etching and grinding techniques.

In accordance with various embodiments, the planarization process may be implemented by using a CMP process. In the CMP process, a combination of etching materials and abrading materials are put into contact with the top surface of the semiconductor device and a grinding pad (not shown) is used to grind away excess conductive materials until the top surface of the polymer layer 302 is level with the top surfaces of the metal lines 202, 204 and 206.

Figure 11A:
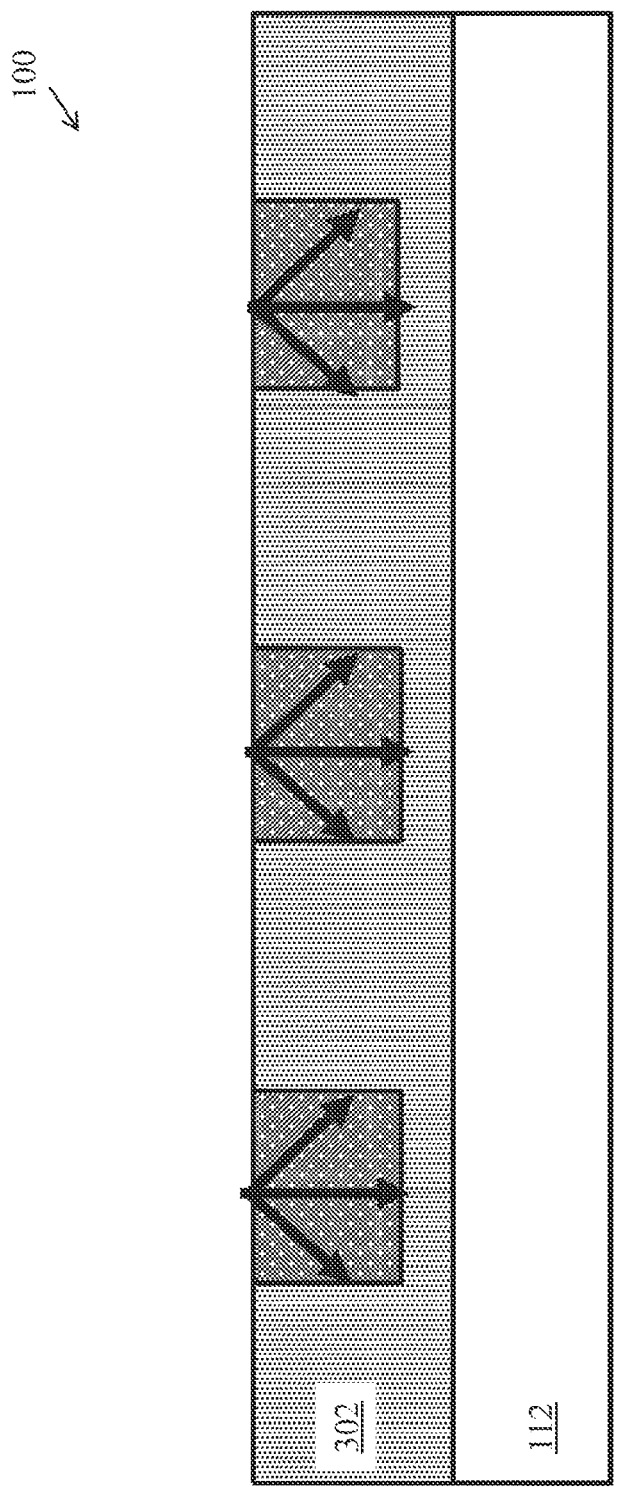

FIG. 11A illustrates a cross sectional view of the semiconductor device shown in FIG. 10 after a selective thermal curing process is applied to the polymer layer in accordance with various embodiments of the present disclosure. In some embodiments, a selective thermal curing process may be employed to cure the polymer material surrounding the metal lines 202, 204 and 206. The selective thermal curing process may be implemented as an infrared (IR) curing process, an ultraviolet (UV) curing process, a microwave curing process, any combinations thereof and/or the like.

In some embodiments, an infrared (IR) system may be employed to cure the polymer material surrounding the metal lines 202, 2014 and 206. The IR light is of a wavelength in a range from about 0.7 um to about 15 um. The IR light is directed onto the top surfaces of the metal lines 202, 204 and 206. In some embodiments, the metal lines 202, 204 and 206 may be formed of copper. Since the thermal conductivity of copper is high (e.g., 401 W/(m·K)), the temperature of the metal lines 202, 204 and 206 may increase rapidly. On the other hand, the polymer layer 302 is of a low thermal conductivity ranging from about 0.1 W/(m·K) to about 1 W/(m·K). As a result, the temperature of the polymer layer 302 increases slowly. Such a temperature difference causes heat transfer from the metal lines 202, 204 and 206 to their surrounding regions as indicated by the arrows.

The heat transmitted from the metal lines 202, 204 and 206 may lead to a thermal imidization process. During the thermal imidization process, the polymer materials surrounding the metal lines 202, 204 and 206 are converted to polyimide, which is a thermally stable polymer. The IR light is applied to the metal lines 202, 204 and 206 until the polyamic acid portions between the metal lines and the top surface of the dielectric layer 112 have been fully converted into polyimide.

In some embodiments, the heating power of the IR system is in a range from about 10 W to about 1000 W. The heating time is in a range from about 30 seconds to about 1 hour. It should be noted that the selection of the heating power and heating time depends on application needs. The uncured portion between two adjacent metal lines (e.g., metal lines 202 and 204) will become an air gap in the subsequent fabrication steps. A longer heating time and/or higher heating power will increase the thickness of the cured portions. As a result, the thickness of the uncured portion may reduce accordingly. As such, the width of the air gap shown in FIG. 1 may be adjustable through controlling the heating time and/or the heating power of the curing process. The detailed formation process of the air gaps will be described below with respect to FIGS. 12-14.

Figure 11B:
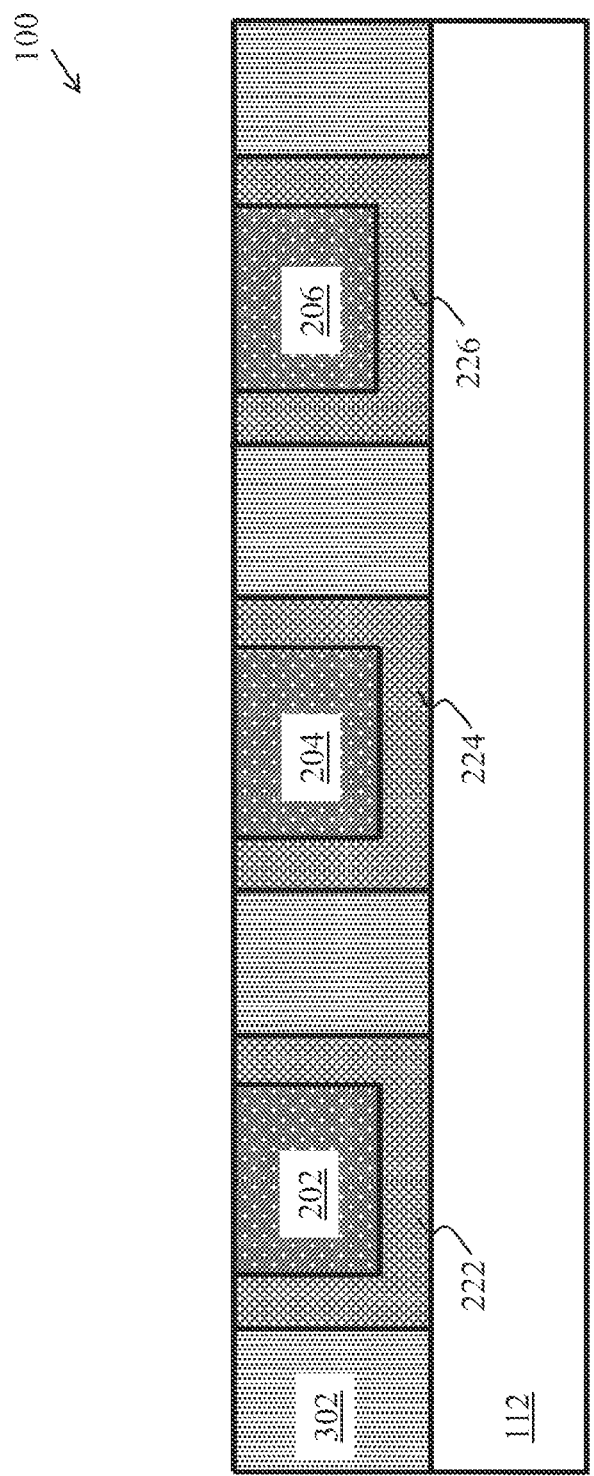

FIG. 11B illustrates a cross sectional view of the semiconductor device shown in FIG. 11A after thermally stable polymer layers have been formed in accordance with various embodiments of the present disclosure. After the thermal process finishes, the polymer layer 302 is divided into uncured portion and cured portions 222, 224 and 226. Each cured portion includes a first sidewall portion, a bottom portion, and a second sidewall portion. The bottom portion is between a bottom surface of a corresponding metal line and the top surface of the dielectric layer 112. The sidewall portions and the bottom portion wrap the metal line (e.g., metal line 202) on three sides. In some embodiments, the bottom portion of the cured portion (e.g., cured portion 222) is of a thickness in a range from about 1 nm to about 5 nm. The sidewall portions (e.g., cured portion 222) are of a thickness approximately equal to the thickness of the bottom portion (e.g., cured portion 222).

In some embodiments, the polymer layer 302 is formed of polyamic acid. The cured portions 222, 224 and 226 are formed of polyimide having the following schematic chemical formula:

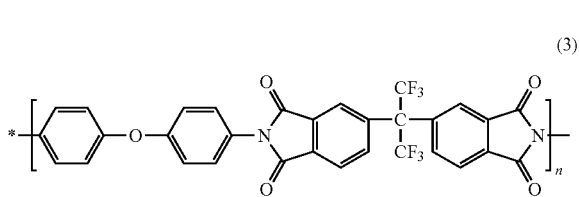

(3)

In some embodiments, the polymer layer 302 is formed of epoxy. The cured portions 222, 224 and 226 are formed of crosslinking epoxy having the following schematic chemical formula:

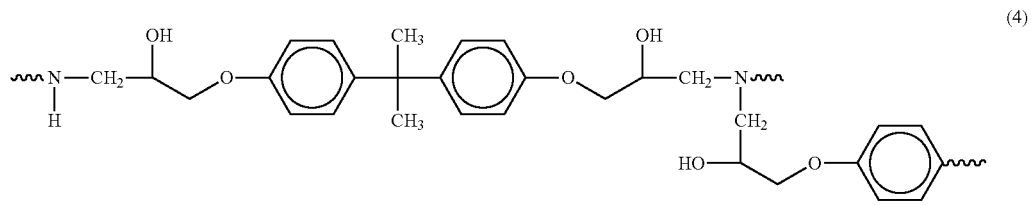

(4)

One advantageous feature of having the cured portions (polyimide or crosslinking epoxy portions) surrounding their respective metal lines is the cured portions shown in FIG. 11B are of high mechanical strength and good thermal stability. In addition, the material (e.g., polyimide or crosslinking epoxy) of the cured portions shown in FIG. 11B also provides high adhesive strength for the metal lines 202, 204 and 206.

Furthermore, the cured portions 222, 224 and 226 are of a low dielectric constant. The cured portions formed of polyimide are of a dielectric constant in a range from about 2.7 to about 3.5. The cured portions formed of crosslinking epoxy are of a dielectric constant in a range from about 3.2 to about 4.6. Such a low dielectric constant helps to reduce the capacitive coupling between adjacent metal lines. Such reduced capacitive coupling may help to improve reliability characteristics of the semiconductor device 100.

Another advantageous feature of having the cured portions surrounding their respective metal lines is the cured portions shown in FIG. 11 is the polyimide portions or the crosslinking epoxy portions may function as a barrier layer. More particularly, in some embodiments, the metal lines 202, 204 and 206 are formed of copper. The copper of the metal lines 202, 204 and 206 is not able to diffuse into the cured portions 222, 224 and 226. As a result, the fabrication process described herein does not require barrier layers formed underneath the metal lines 202, 204 and 206.

Figure 12:
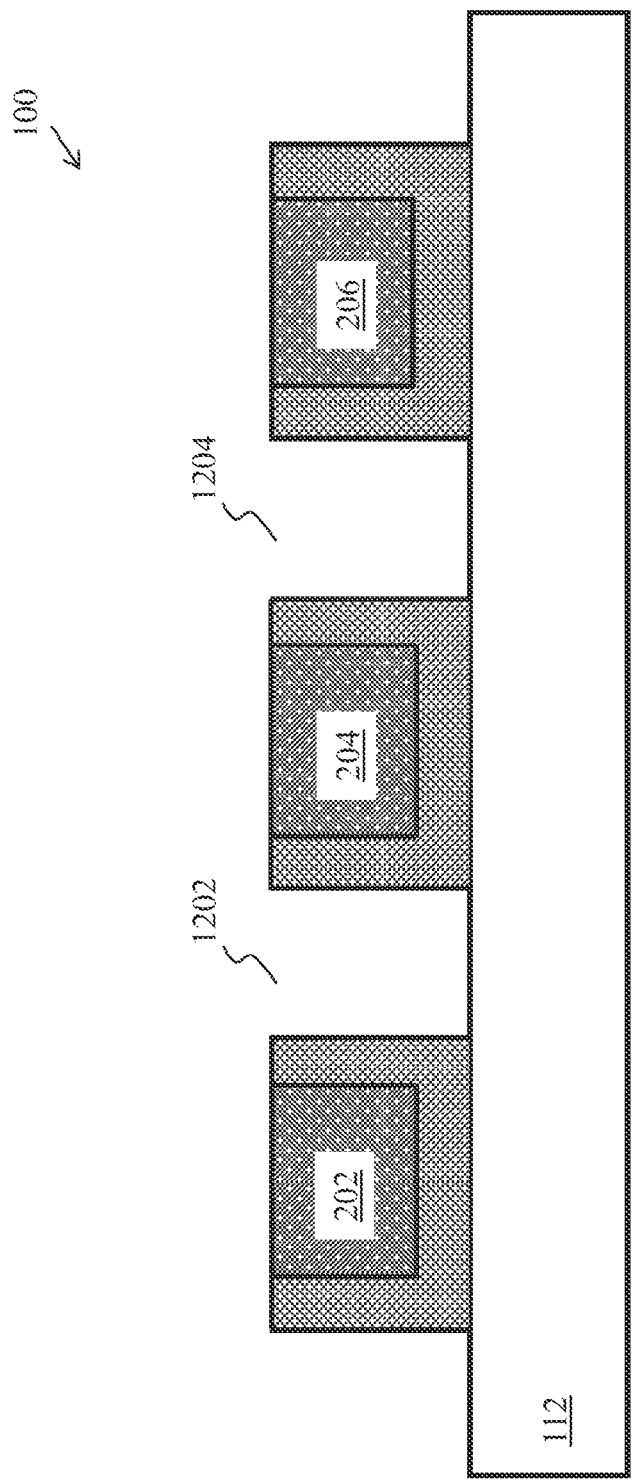

FIG. 12 illustrates a cross sectional view of the semiconductor device shown in FIG. 11B after a cleaning process is applied to the polymer layer in accordance with various embodiments of the present disclosure. The uncured polymer layer 302 shown in FIG. 11B may be removed by using suitable solvents.

In some embodiments, the uncured polymer layer 302 formed of polyamic acid may be removed by suitable solvents including dimethylacetamide (DMAc), N-Methyl-2-pyrrolidone (NMP) and/or the like. The molecular formula of DMAc is $C_4H_9NO$. The molar mass of DMAc is 87.12 g mol$^{-1}$. The molecular formula of NMP is $C_5H_9NO$. The molar mass of NMP is 99.13 g mol$^{-1}$.

In some embodiments, the uncured polymer layer 302 formed of epoxy may be removed by suitable solvents including Acetone, Tetrahydrofuran and/or the like. The molecular formula of Acetone is $C_3H_6O$. The molar mass of Acetone is 53.08 g mol$^{-1}$. The molecular formula of Tetrahydrofuran is $C_4H_8O$. The molar mass of Tetrahydrofuran is 72.11 g mol$^{-1}$.

After the cleaning process finishes, the uncured portions shown in FIG. 11B have been removed as shown in FIG. 12. Two trenches 1202 and 1204 have been formed. The first trench 1202 is between the metal line 202 and the metal line 204. The second trench 1204 is between the metal line 204 and the metal line 206. It should be noted the width of the air gaps is adjustable. By controlling the uncured portion's width, the air gap's width may be adjusted accordingly.

In a conventional etching based trench formation process, in order to form trenches, a dry etching process may be employed. The dry etching process, however, may cause metal damages (e.g., barrier damages) that may affect physical and electrical characteristics of the semiconductor device. One advantageous feature of having the cleaning process above is that the solvent based cleaning process does not cause metal damages during the formation of trenches 1202 and 1204.

Figure 13:
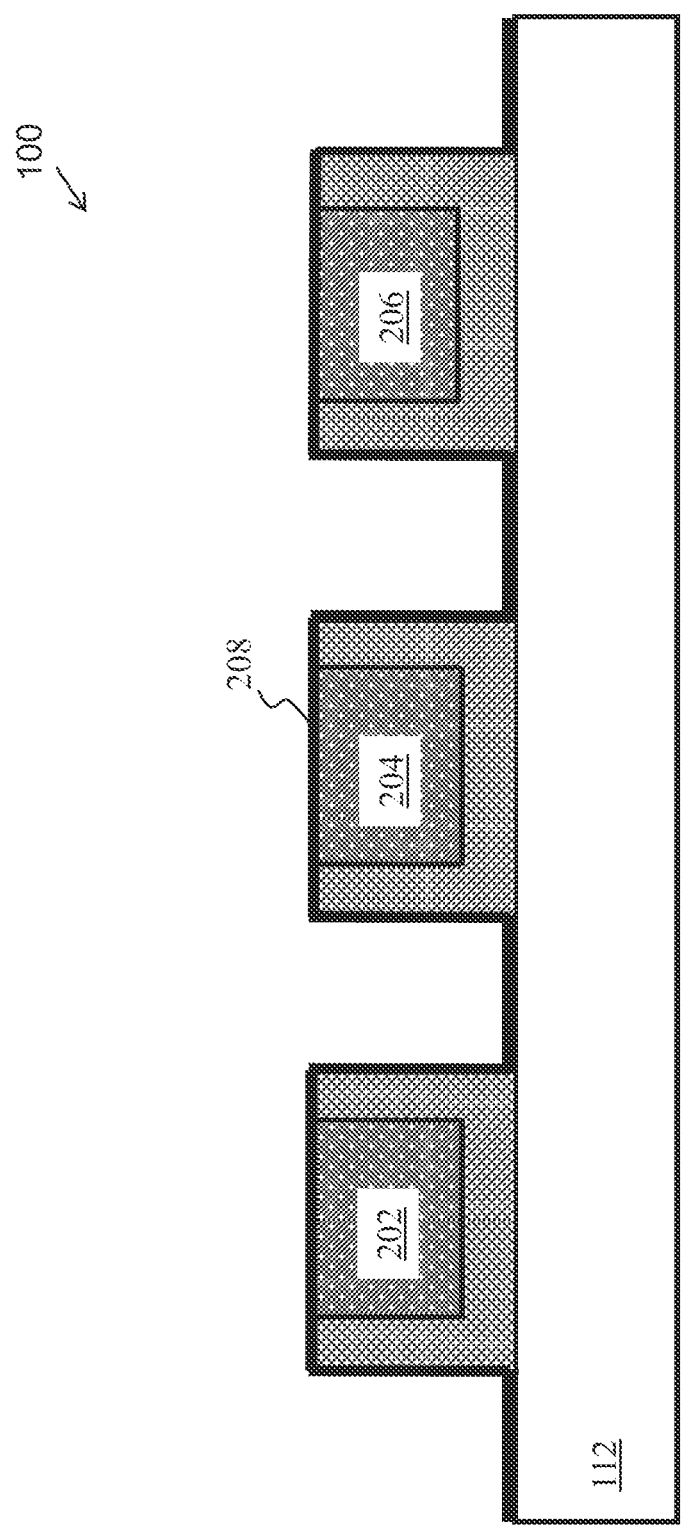

FIG. 13 illustrates a cross sectional view of the semiconductor device shown in FIG. 12 after an etch stop layer is formed over the semiconductor device in accordance with various embodiments of the present disclosure. The etch stop layer 208 may be formed over the exposed portions of the semiconductor device as shown in FIG. 13. The etch stop layer 208 may be a dielectric material such as such as silicon nitride, silicon oxynitride, silicon oxycarbide, silicon carbide, combinations thereof, and multi-layers thereof. In some embodiments, the etch stop layer 208 may be formed using a suitable deposition process such as CVD, PECVD, atomic layer deposition (ALD) and/or the like. The etch stop layer 208 may be of a thickness in a range from about 300 Angstroms to about 1,500 Angstroms.

Figure 14:
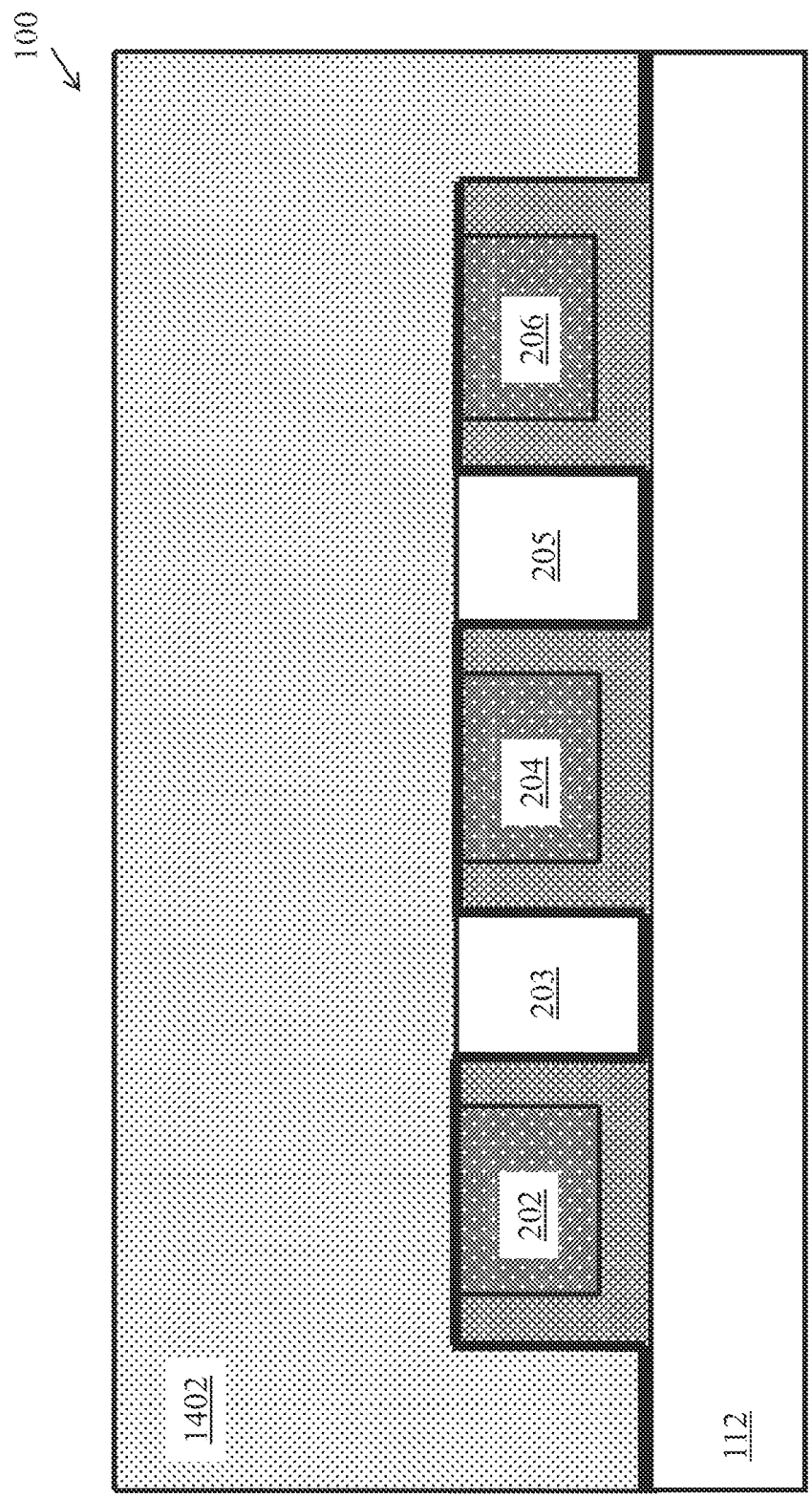

FIG. 14 illustrates a cross sectional view of the semiconductor device shown in FIG. 13 after air gaps are formed in accordance with various embodiments of the present disclosure. A dielectric material 1402 may be deposited over the semiconductor device 100 through suitable deposition techniques such as a conformal deposition technique. As shown in FIG. 14, after the dielectric layer 1402 is deposited over the semiconductor device 100, two air gaps 203 and 205 may be formed due to the higher aspect ratio (i.e., the ratio between the gap height and gap width) of the openings between two adjacent metal lines. As shown in FIG. 14, the narrow gap width may result in overhangs formed in the upper portions of the gap. Such overhangs may prevent the dielectric material from filling the openings so that air gaps 203 and 205 are formed as shown in FIG. 14.

As shown in FIG. 14, the air gaps 203 and 205 are of a rectangular shape. It should further be noted that the shape shown in FIG. 14 is selected purely for demonstration purposes and are not intended to limit the various embodiments of the present disclosure. For example, it is within the scope and spirit of the present disclosure for the air gaps 203 and 205 to comprise other shapes, such as, but no limited to oval, square, triangle and/or the like.

One advantageous feature having the air gaps 203 and 205 shown in FIG. 12 is that the air in the air gaps 203 and 205 exhibits a permittivity approximately equal to 1. Such a low permittivity helps to reduce the capacitive coupling between adjacent metal lines (e.g., metal lines 202 and 204). Such reduced capacitive coupling may help to improve reliability characteristics.

Figure 15:
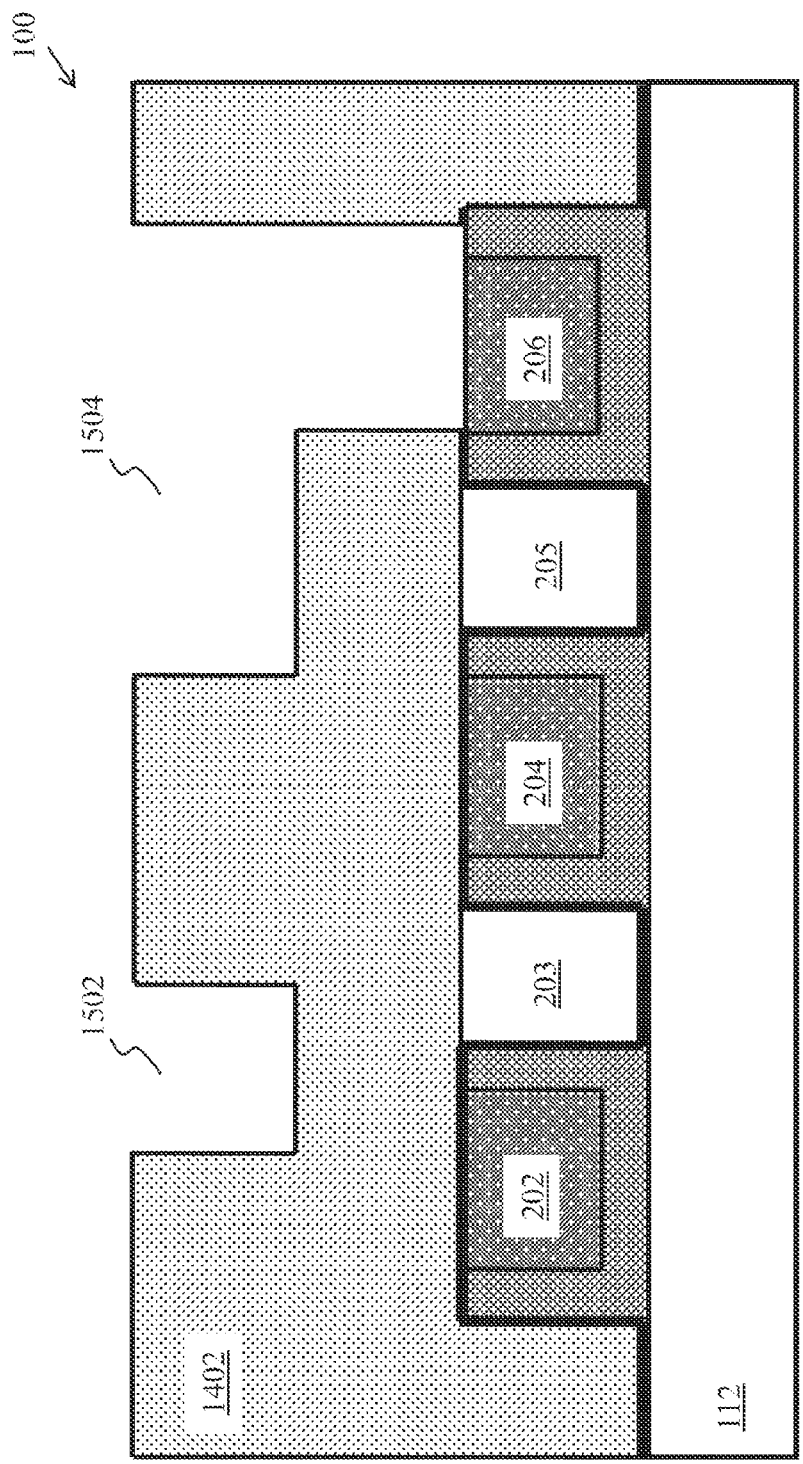

FIG. 15 illustrates a cross sectional view of the semiconductor device shown in FIG. 14 after a plurality of opening are formed in accordance with various embodiments of the present disclosure. According to the location and shape of the metal lines 212 and 214, and via 217, openings 1502 and 1504 are formed in the dielectric layer 1402. The openings 1502 and 1504 may be formed by a dual damascene process, although other suitable techniques such as single damascene may alternatively be used. The dual damascene process is well known in the art, and hence is not discussed herein.

It should be noted that fabrication defects such as via punch-through issues do not exist in the process of forming the via 217. More particularly, the polyimide layer surrounding the metal line 206 may help to prevent the via hole from punching through to the air gap 205.

Figure 16:
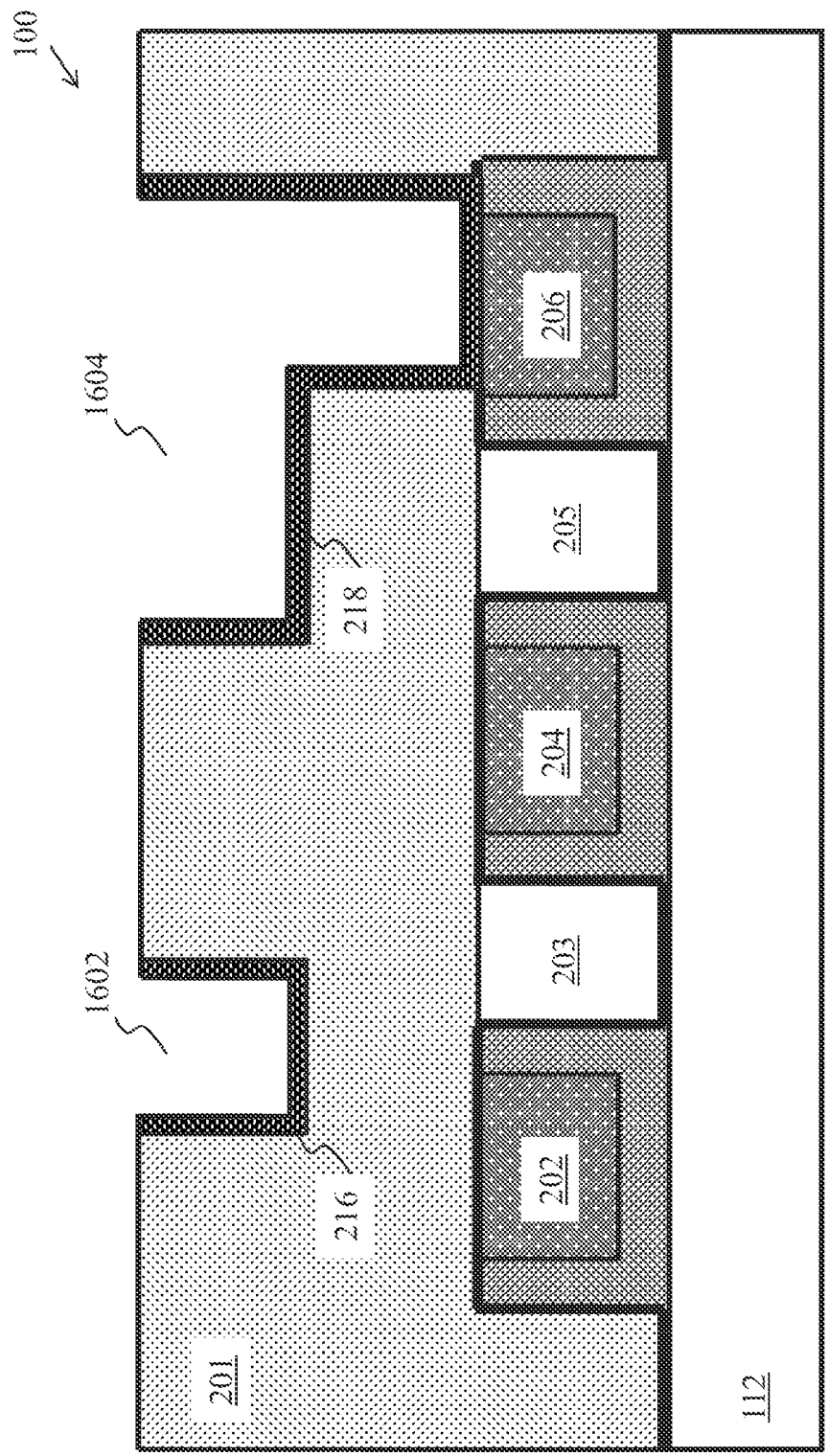

FIG. 16 illustrates a cross sectional view of the semiconductor device shown in FIG. 15 after two barrier layers are formed in accordance with various embodiments of the present disclosure. The barrier layers 216 and 218 may be deposited on the sidewalls as well as the bottoms of their respective openings. The barrier layers 216 and 218 may be formed of titanium, titanium nitride, tantalum, tantalum nitride, and combinations thereof and/or the like. The barrier layers 216 and 218 may be formed using suitable fabrication techniques such as ALD, PECVD and/or the like.

Figure 17:
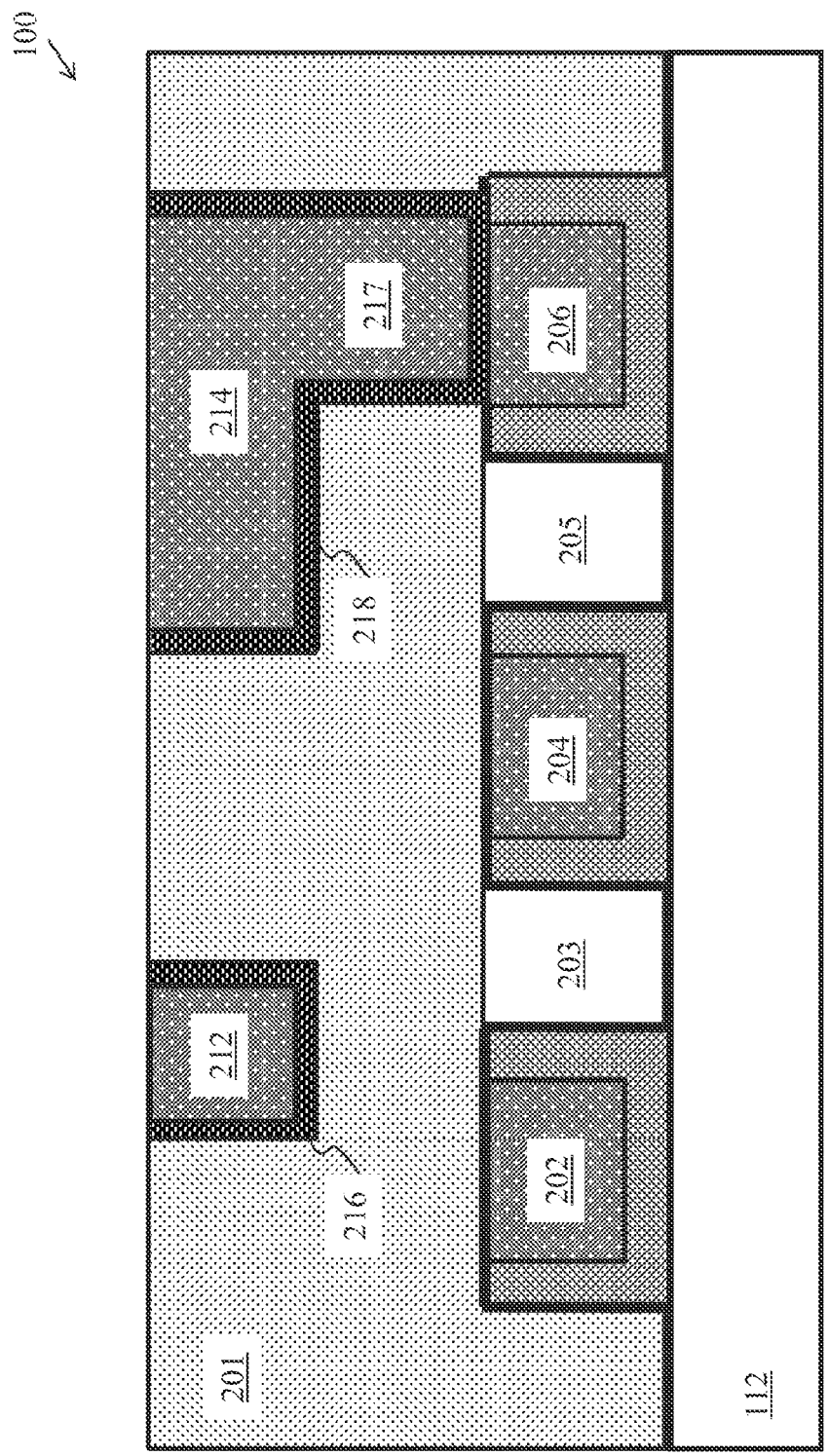

FIG. 17 illustrates a cross sectional view of the semiconductor device shown in FIG. 16 after a conductive material is filled in the openings in accordance with various embodiments of the present disclosure. A conductive material is then filled in the openings 1602, and 1604. The conductive material may be copper, but can be any suitable conductive materials, such as copper alloys, aluminum, tungsten, titanium, silver, any combinations thereof and/or the like. The conductive material may be formed by suitable fabrication techniques such as an electro-less plating process, CVD, electro-plating and/or the like.

A planarization process is performed to remove excess conductive materials to form the metal lines 212 and 214. The planarization process may be implemented by using suitable techniques such as grinding, polishing and/or chemical etching, a combination of etching and grinding techniques.

Figure 18:
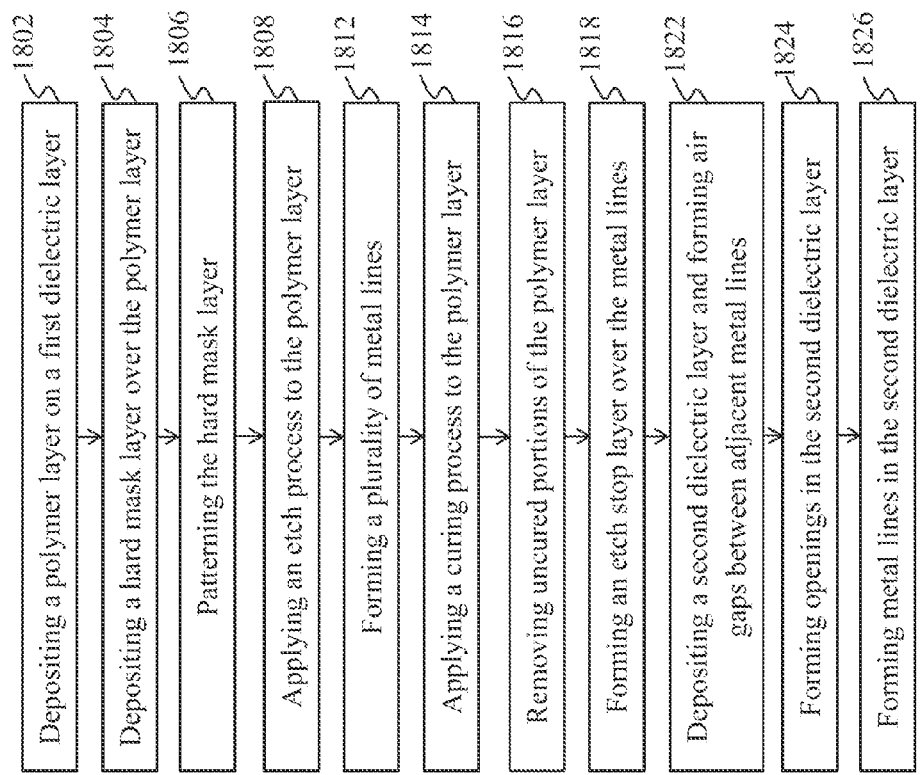
FIG. 18 illustrates a flow chart of a method for forming the semiconductor device shown in FIG. 1 in accordance with various embodiments of the present disclosure.

FIG. 18 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 18 may added, removed, replaced, rearranged and repeated.

At step 1802, a polymer layer is deposited on a dielectric layer. The polymer layer may be formed of suitable materials such as polyamic acid, epoxy and/or the like. At step 1804, a hard mask layer is formed over the polymer layer. At step 1806, a patterning process is applied to the polymer layer. At step 1808, a suitable etching process is employed to form a plurality of openings partially through the polymer layer. At step 1812, a conductive material is filled in the openings to form a plurality of metal lines. At step 1814, a curing process is applied to the metal lines. As a result, the polymer portions surrounding the metal lines have been cured to form polyimide or crosslinking epoxy regions.

At step 1816, a cleaning process is employed to remove the uncured portions of the polymer layer. At step 1818, an etch stop layer is formed over the metal lines. At step 1822, a second dielectric layer is deposited over the metal lines. Air gaps are formed between adjacent metal lines. At step 1824, a plurality of openings are formed in the second dielectric layer. At step 1826, a conductive material is filled in the openings to form a plurality of metal lines in the second dielectric layer.

Figure 19:
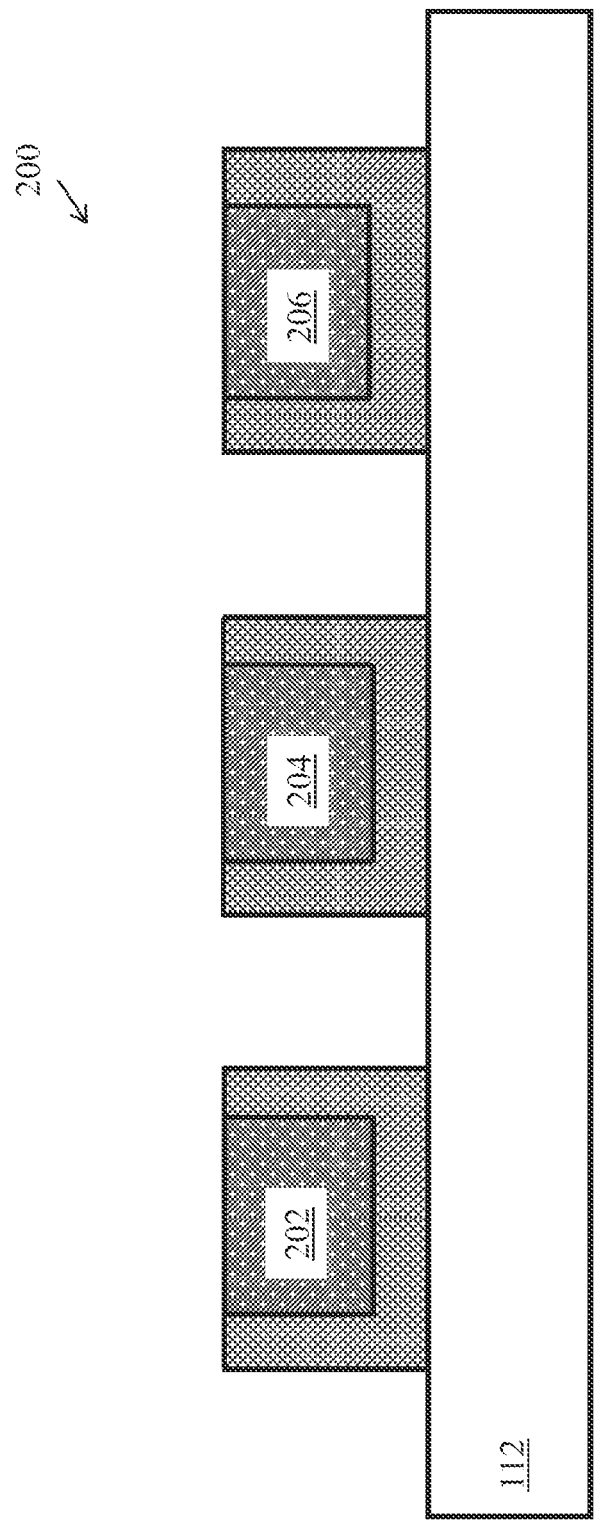
FIGS. 19-22 illustrate intermediate steps of fabricating the semiconductor device shown in FIG. 2 in accordance with various embodiments of the present disclosure.

FIGS. 19-22 illustrate intermediate steps of fabricating the semiconductor device shown in FIG. 2 in accordance with various embodiments of the present disclosure. The steps for fabricating the semiconductor device 200 shown in FIG. 19 are similar to the steps shown in FIGS. 3-12, and hence are not discussed in further detail herein to avoid unnecessary repetition.

Figure 20:
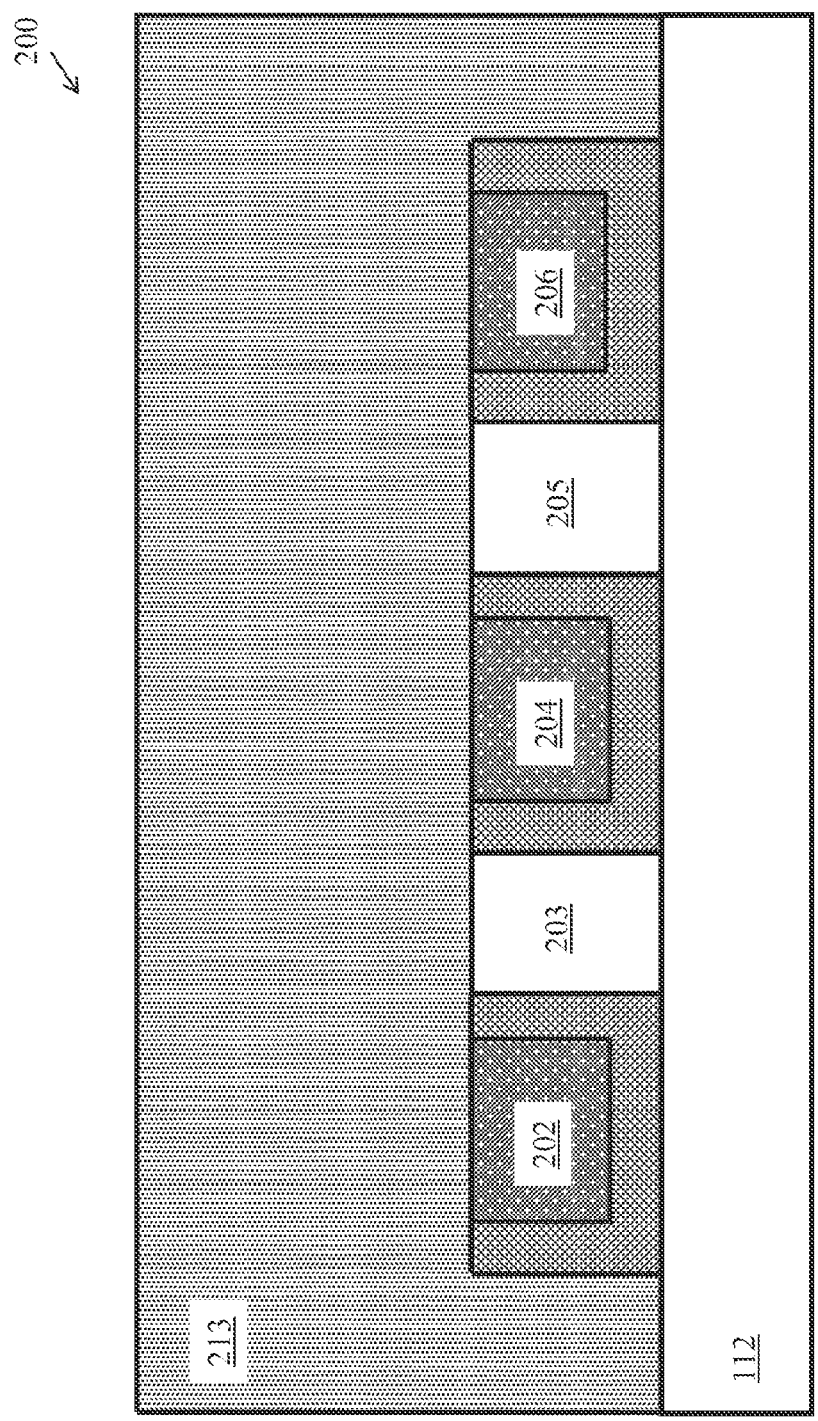

FIG. 20 illustrates a cross sectional view of the semiconductor device shown in FIG. 19 after a polymer layer is formed over the semiconductor device in accordance with various embodiments of the present disclosure. The polymer layer 213 is formed of polyamic acid, epoxy and/or the like. The formation and structure of polyamic acid and epoxy have been described in detail above with respect to FIG. 4, and hence are not discussed again to avoid repetition. The formation process of air gaps 203 and 205 shown in FIG. 20 is similar to that shown in FIG. 14, and hence is not discussed again herein.

After the polymer layer has been deposited, a curing process is employed to cure the polymer layer 213. During the curing process, the semiconductor device 200 may be baked in a thermal chamber. The curing time is in a range from about 2 minutes to about 4 minutes. The curing temperature is in a range from about 250 degrees to about 400 degrees. After the curing process finishes, the polymer layer 213 formed of polyamic acid is converted into a fully cured polyimide layer.

Figure 21:
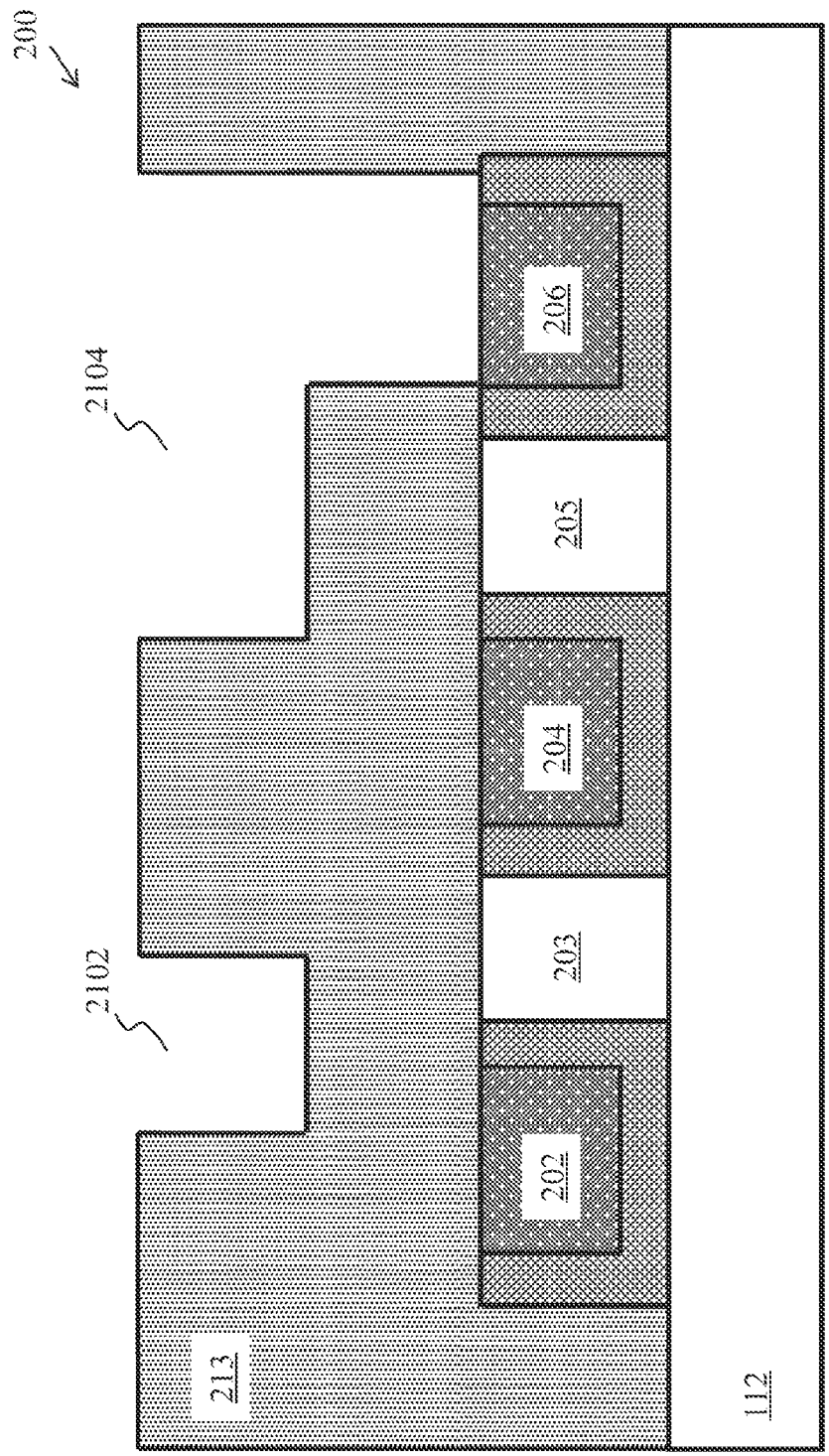

FIG. 21 illustrates a cross sectional view of the semiconductor device shown in FIG. 20 after a plurality of opening are formed in accordance with various embodiments of the present disclosure. According to the location and shape of the metal lines 212 and 214, and via 217, openings 2102 and 2104 are formed in the polymer layer 213. The openings 2102 and 2104 may be formed by a dual damascene process, although other suitable techniques such as single damascene may alternatively be used.

Figure 22:
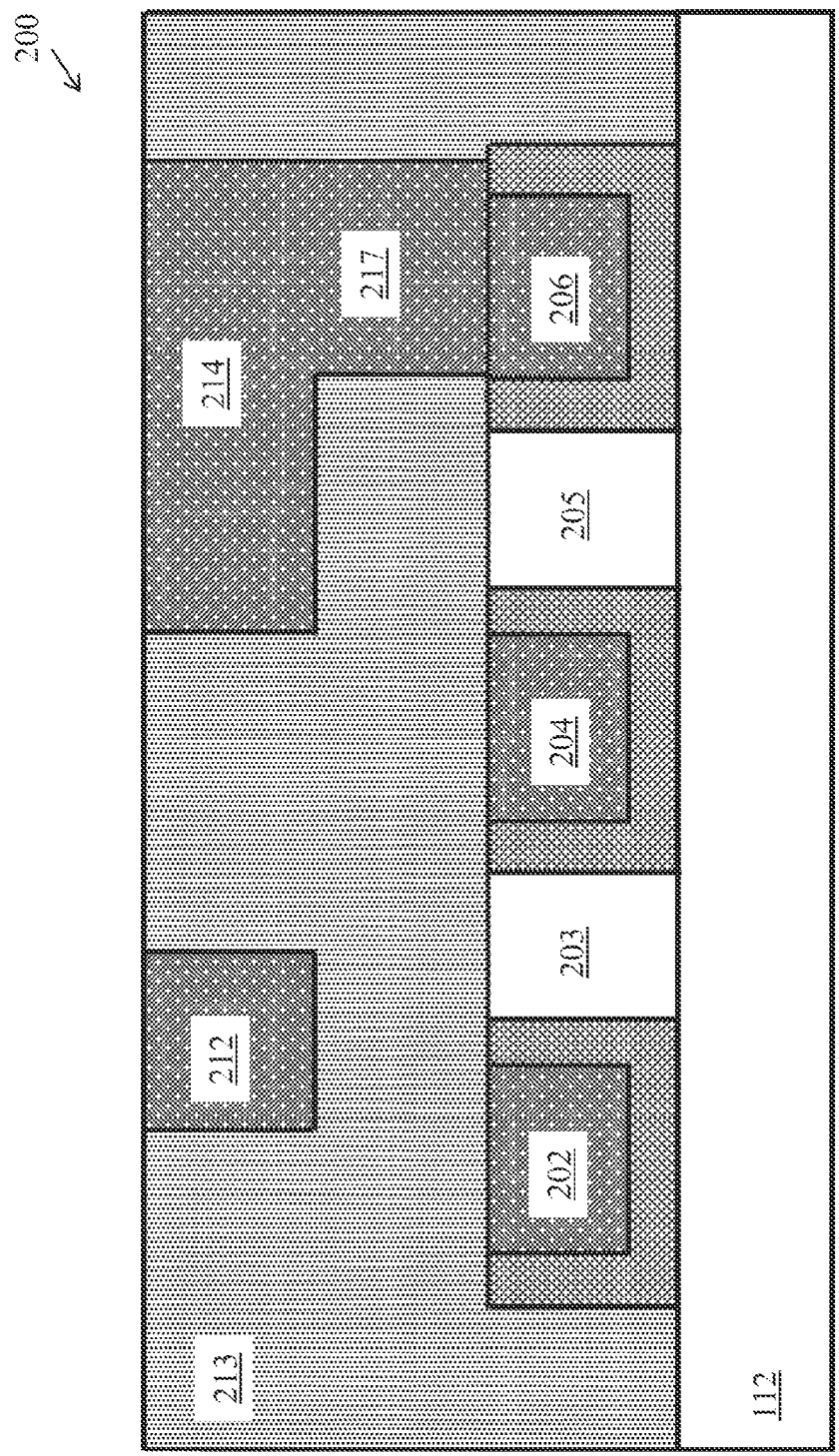

FIG. 22 illustrates a cross sectional view of the semiconductor device shown in FIG. 21 after a conductive material is filled in the openings in accordance with various embodiments of the present disclosure. A conductive material is filled in the openings 2102 and 2104. The conductive material may be copper, but can be any suitable conductive materials, such as copper alloys, aluminum, tungsten, titanium, silver, any combinations thereof and/or the like. The conductive material may be formed by suitable fabrication techniques such as an electro-less plating process, CVD, electroplating and/or the like.

A planarization process is performed to remove excess conductive materials in accordance with various embodiments of the present disclosure. The planarization process may be implemented by using suitable techniques such as grinding, polishing and/or chemical etching, a combination of etching and grinding technique.

It should be noted that the conductive material such as copper may be filled in the opening directly without having a barrier layer. The conductive material such as copper is not able to diffuse into the polymer layer 213. As a result, the barrier layer is not formed in the openings. Such a barrier free structure shown in FIG. 22 helps to reduce the resistance between the via 217 and the metal line 206.

Figure 23:
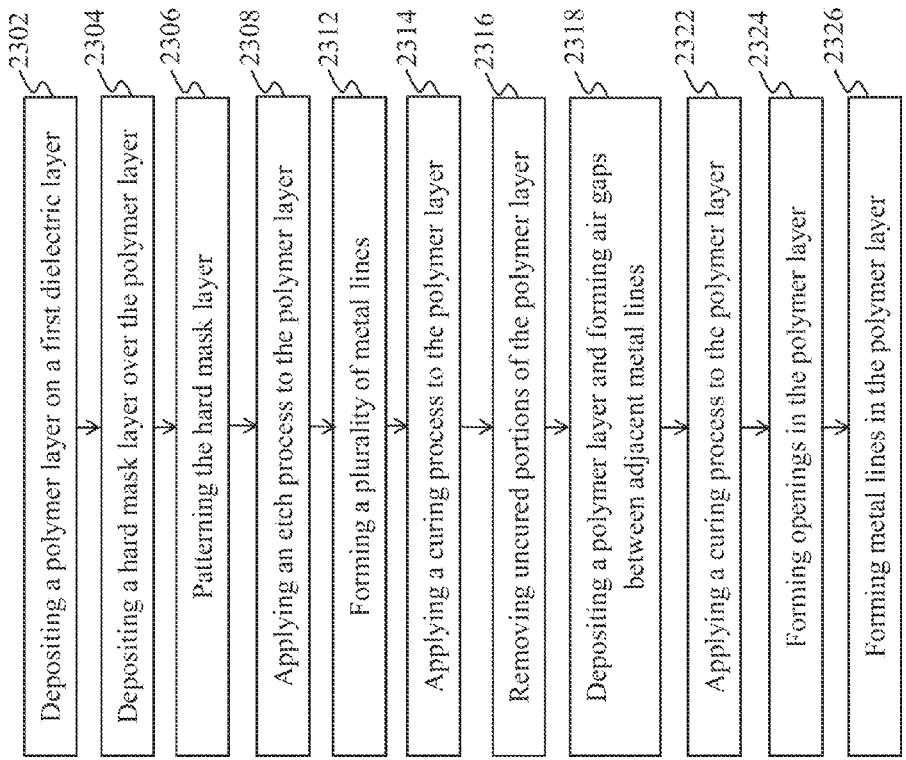
FIG. 23 illustrates a flow chart of a method for forming the semiconductor device 200 shown in FIG. 2 in accordance with various embodiments of the present disclosure.

FIG. 23 illustrates a flow chart of a method for forming the semiconductor device 200 shown in FIG. 2 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 23 may added, removed, replaced, rearranged and repeated.

The steps 2302-2316 shown in FIG. 23 are similar to the steps 1802-1816 shown in FIG. 18, and hence are not discussed herein to avoid repetition. At step 2318, a polymer layer is deposited over the semiconductor device. Air gaps are formed between adjacent metal lines. At step 2322, a curing process is applied to the polymer layer. The polymer material is converted into a thermally stable polymer. At step 2324, a plurality of openings are formed in the thermally stable polymer layer. At step 2326, a conductive material is filled in the openings to form metal lines and vias.

In accordance with an embodiment, an apparatus comprises a first conductive line in a first metallization layer over a dielectric layer, wherein the first conductive line is wrapped by a first polymer layer on three sides and the first conductive line and the dielectric layer are separated by a bottom portion of the first polymer layer, a second conductive line over the dielectric layer, wherein the second conductive line is wrapped by a second polymer layer on three sides and the second conductive line and the dielectric layer are separated by a bottom portion of the second polymer layer and an air gap between the first conductive line and the second conductive line.

In accordance with an embodiment, a device comprises a first metallization layer over a dielectric layer, wherein the first metallization layer comprises a first metal line wrapped by a first polymer layer on three sides and an air gap adjacent to the first metal line, wherein the air gap and the first metal line are separated by a sidewall of the first polymer layer.

The device further comprises a second metallization layer over the first metallization layer, wherein a top surface of the first metal line is in direct contact with a bottom surface of the second metallization layer and a bottom surface of the first metal line and the dielectric layer are separated by a bottom of the first polymer layer.

In accordance with an embodiment, a method comprises depositing a first polymer layer over a dielectric layer, forming a first opening and a second opening using an etching process, wherein the first opening and the second opening are partially through the first polymer layer, filling the first opening and the second opening with a conductive material to form a first metal line and a second metal line, applying a selective thermal curing process to the first polymer layer until portions of the first polymer layer surrounding the first metal line and the second metal line are cured, removing uncured portions of the first polymer layer through a cleaning process and depositing a dielectric layer to form an air gap between the first metal line and the second metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a first conductive line in a first metallization layer over a dielectric layer, wherein:
the first conductive line is wrapped by a first polymer layer on three sides; and
the first conductive line and the dielectric layer are separated by a bottom portion of the first polymer layer;
a second conductive line over the dielectric layer, wherein:
the second conductive line is wrapped by a second polymer layer on three sides; and
the second conductive line and the dielectric layer are separated by a bottom portion of the second polymer layer; and
an air gap between the first conductive line and the second conductive line.

2. The apparatus of claim 1, wherein:
the first polymer layer and the second polymer layer comprise polyimide.

3. The apparatus of claim 1, wherein:
the first polymer layer and the second polymer layer comprise crosslinking epoxy.

4. The apparatus of claim 1, wherein:
the first polymer layer comprises a first sidewall, a second sidewall and a first bottom, and wherein the first conductive line is wrapped by the first sidewall, the second sidewall and the first bottom on three sides; and
the second polymer layer comprises a third sidewall, a fourth sidewall and a second bottom, and wherein the second conductive line is wrapped by the third sidewall, the fourth sidewall and the second bottom on three sides.

5. The apparatus of claim 4, wherein:
the air gap is between the second sidewall of the first polymer layer and the third sidewall of the second polymer layer.

6. The apparatus of claim 1, further comprising:
a second metallization layer over the first metallization layer, wherein the air gap is between the second metallization layer and the dielectric layer.

7. The apparatus of claim 6, wherein:
the second metallization layer comprises a plurality of metal lines formed in a polymer layer.

8. A device comprising:
a first metallization layer over a dielectric layer, wherein the first metallization layer comprises:
a first metal line wrapped by a first polymer layer on three sides; and
an air gap adjacent to the first metal line, wherein the air gap and the first metal line are separated by a sidewall of the first polymer layer; and
a second metallization layer over the first metallization layer, wherein:
a top surface of the first metal line is in direct contact with a bottom surface of the second metallization layer; and
a bottom surface of the first metal line and the dielectric layer are separated by a bottom of the first polymer layer.

9. The device of claim 8, wherein:
the bottom of the first polymer layer is of a thickness in a range from about 1 nm to about 5 nm.

10. The device of claim 8, further comprising:
a second metal line wrapped by a second polymer layer on three sides, wherein the air gap is between the first metal line and the second metal line.

11. The device of claim 8, wherein:
the first polymer layer comprises polyimide.

12. The device of claim 8, wherein:
the first polymer layer comprises crosslinking epoxy.

13. The device of claim 8, wherein:
the second metallization layer comprises a via surrounded by a polymer material, wherein a bottom surface of the via is in direct contact with a top surface of a metal line of the first metallization layer.

14. The device of claim 13, wherein:
the via and the metal line comprise copper.

15. An apparatus comprising:
a first metal line in a first metallization layer over a dielectric layer, wherein:
  a bottom and sidewalls of the first metal line are surrounded by a first polymer layer;
a second metal line over the dielectric layer, wherein:
  a bottom and sidewalls of the second metal line are surrounded by a second polymer layer; and
an air gap between the first metal line and the second metal line, wherein the air gap extends from a sidewall portion of the first polymer layer to a sidewall portion of the second polymer layer.

16. The apparatus of claim 15, wherein:
a top of the air gap is level with a top surface of the first metal line.

17. The apparatus of claim 15, wherein:
the first metal line and the dielectric layer are separated by a bottom portion of the first polymer layer; and
the second metal line and the dielectric layer are separated by a bottom portion of the second polymer layer.

18. The apparatus of claim 15, further comprising:
an etch stop layer formed on a bottom and sidewalls of the air gap.

19. The apparatus of claim 15, wherein:
the first polymer layer comprises polyimide; and
the second polymer layer comprises polyimide.

20. The apparatus of claim 15, wherein:
the first polymer layer comprises crosslinking epoxy; and
the second polymer layer comprises crosslinking epoxy.

* * * * *